(12) United States Patent
Kawasaki

(10) Patent No.: US 9,088,250 B2
(45) Date of Patent: Jul. 21, 2015

(54) DISTORTION COMPENSATING APPARATUS AND DISTORTION COMPENSATING METHOD

(71) Applicant: FUJITSU LIMITED, Kawasaki-shi, Kanagawa (JP)

(72) Inventor: Toshio Kawasaki, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 37 days.

(21) Appl. No.: 13/927,816

(22) Filed: Jun. 26, 2013

(65) Prior Publication Data

US 2014/0002186 A1    Jan. 2, 2014

(30) Foreign Application Priority Data

Jun. 29, 2012   (JP) ................. 2012-147336

(51) Int. Cl.
  *H03F 1/26* (2006.01)
  *H03F 1/32* (2006.01)
  *H03F 1/02* (2006.01)
  *H03F 1/42* (2006.01)
  *H03F 3/24* (2006.01)

(52) U.S. Cl.
  CPC ............ *H03F 1/3252* (2013.01); *H03F 1/0294* (2013.01); *H03F 1/26* (2013.01); *H03F 1/3247* (2013.01); *H03F 1/42* (2013.01); *H03F 3/24* (2013.01)

(58) Field of Classification Search
  CPC ........................................................ H03F 1/26
  USPC .................. 330/149; 375/296–297; 455/114.3
  See application file for complete search history.

(56) References Cited

U.S. PATENT DOCUMENTS

| 6,054,896 A * | 4/2000 | Wright et al. ................ 330/149 |
| 2009/0163154 A1 | 6/2009 | Fonden et al. |

FOREIGN PATENT DOCUMENTS

| JP | 05-037263 A | 2/1993 |
| JP | 09-074320 A | 3/1997 |
| JP | 2003-152464 A | 5/2003 |
| JP | 2003-298361 A | 10/2003 |
| JP | 2006-033988 A | 2/2006 |
| JP | 2009-533947 A | 9/2009 |

* cited by examiner

*Primary Examiner* — Robert Pascal
*Assistant Examiner* — Khiem Nguyen
(74) *Attorney, Agent, or Firm* — Arent Fox LLP

(57) ABSTRACT

A distortion compensating apparatus including: a processor to generate a compensated signal by performing distortion compensation on an input signal, based on a distortion compensation coefficient depending on the input signal, to separates the compensated signal into a first signal and a second signal that have constant amplitude and that have a phase difference based on amplitude of the compensated signal, to generate a third signal by multiplying the first signal by a first coefficient, and to generate a fourth signal by multiplying the second signal by a second coefficient, and a combiner to generate a seventh signal by combining the fifth signal and the sixth signal which are generated by amplifying the third signal and the fourth signal, wherein the processor is further configured to calculate the distortion compensation coefficient, the first coefficient, and the second coefficient, based on the third signal, the fourth signal and the seventh signal.

3 Claims, 11 Drawing Sheets

RELATED ART

DISTORTION COMPENSATING APPARATUS AND DISTORTION COMPENSATING METHOD

CROSS-REFERENCE TO RELATED APPLICATION

This application is based upon and claims the benefit of priority from the prior Japanese Patent Application No. 2012-147336 filed on Jun. 29, 2012, the entire contents of which are incorporated herein by reference.

FIELD

The embodiments discussed herein are related to a distortion compensating apparatus and a distortion compensating method.

BACKGROUND

High-frequency amplifying circuits that include an amplifier based on linear amplification with nonlinear components (LINC) are known as units for implementing a high-efficiency liner amplifier.

FIG. 1 is a diagram illustrating an example of a LINC-based amplifier. In the LINC-based amplifier, a LINC signal generating unit separates an input modulation signal Sin(t) into a pair of phase modulation signals Sc1($t$) and Sc2($t$) and outputs the pair of phase modulation signals Sc1($t$) and Sc2($t$). The phase difference between the phase modulation signals Sc1($t$) and Sc2($t$) corresponds to the amplitude of the input modulation signal Sin(t). For example, the input modulation signal Sin(t) is a modulation signal exhibiting amplitude modulation and phase modulation (angular modulation) and the pair of phase modulation signals Sc1($t$) and Sc2($t$) are constant-envelope, constant-amplitude phase modulation signals. Here, the input modulation signal Sin(t) and the pair of the phase modulation signals Sc1($t$) and Sc2($t$) may be baseband signals or intermediate frequency (IF) signals. The LINC signal generating unit outputs the pair of phase modulation signals Sc1($t$) and Sc2($t$) as digital signals.

Here, the signals Sin(t), Sc1($t$), and Sc2($t$) are represented, for example, by Expression 1.

$$\mathrm{Sin}(t) = a(t) \cdot \cos\theta(t) \quad \text{[Expression 1]}$$
$$Sc1(t) = a_{max} \cdot \cos(\theta(t) + \psi(t))$$
$$Sc2(t) = a_{max} \cdot \cos(\theta(t) - \psi(t))$$
$$\psi(t) = \cos^{-1}\left(\frac{a(t)}{2 \cdot a_{max}}\right)$$

In Expression 1, "a(t)" represents the amplitude component of the input modulation signal Sin(t), "θ(t)" represents the phase component of the input modulation signal Sin(t). Phase modulation is provided so that a phase difference of 2×ψ(t), which corresponds to the amplitude a(t), is generated. Furthermore, "$a_{max}$" represents the maximum value of the amplitude a(t) and is a constant. The signals Sc1($t$) and Sc2($t$) are constant envelope signals. That is, the amplitude of the signals Sc1($t$) and Sc2($t$) is fixed.

The signal Sc1($t$), one of the pair of phase modulation signals output from the LINC signal generating unit, is converted from a digital signal into an analog signal by a digital-to-analog converter (DAC). Furthermore, when the converted analog signal passes through a low-pass filter, a component corresponding to a frequency band of the phase modulation signal Sc1($t$) is extracted, and the other frequency components are suppressed. Similarly, the signal Sc2($t$), the other of the pair of phase modulation signals, is converted from a digital signal to an analog signal by a DAC. Furthermore, when the converted analog signal passes through a low-pass filter, a component corresponding to the frequency band of the phase modulation signal Sc2($t$) is extracted, and other frequency components are suppressed.

In the LINC-based amplifier, a quadrature modulator performs quadrature modulation on the phase modulation signal Sc1($t$) which has passed through the corresponding low-pass filter. A frequency converter generates, using a high-frequency signal (oscillation signal) output from an oscillator, a signal S1($t$), which is one of a pair of high-frequency signals that are radio-frequency (RF) signals, and outputs the generated high-frequency signal S1($t$). Similarly, a quadrature modulator performs quadrature modulation on the phase modulation signal Sc2($t$) which has passed through the corresponding low-pass filter. A frequency converter generates, using a high-frequency signal output from an oscillator, a signal S2($t$), which is the other of the pair of high-frequency signals that are RF signals, and outputs the generated high-frequency signal S2($t$).

The high-frequency signals S1($t$) and S2($t$) are represented by Expression 2, where "fc" represents a radio frequency (the frequency of the oscillator).

$$S1(t) = a_{max} \cdot \cos(2\pi \cdot fc \cdot t + \theta(t) + \psi(t))$$
$$S2(t) = a_{max} \cdot \cos(2\pi \cdot fc \cdot t + \theta(t) - \psi(t)) \quad \text{[Expression 2]}$$

A pair of amplifiers include two amplifiers arranged in parallel to each other. The gain and phase characteristics of the two amplifiers are substantially the same. The amplifiers each amplify a high-frequency signal output from the corresponding frequency converter. A portion from the DAC to the amplifier (amplifier A or B) inclusive is also called one branch.

A combiner combines the pair of high-frequency signals amplified by the pair of amplifiers together, and outputs the combined signal as a high-frequency signal Sout(t). The signal Sout(t) output from the combiner is represented by Expression 3, where "G" represents the gain of the amplifiers.

$$Sout(t) = G \cdot a_{max} \cdot \cos(2\pi \cdot fc \cdot t + \theta(t) + \psi(t) + \phi) + \quad \text{[Expression 3]}$$
$$G \cdot a_{max} \cdot \cos(2\pi \cdot fc \cdot t + \theta(t) - \psi(t) + \phi)$$
$$= 2G \cdot a_{max} \cdot \cos(2\pi \cdot fc \cdot t + \theta(t) + \phi)\cos(\psi(t))$$
$$= 2G \cdot a(t) \cdot \cos(2\pi \cdot fc \cdot t + \theta(t) + \phi)$$

In Expression 3, "φ" represents the transmission phase of the pair of high-frequency signals S1($t$) and S2($t$).

Related arts are disclosed in, for example, Japanese National Publication of International Patent Application No. 2009-533947 and Japanese Laid-open Patent Publication Nos. 2003-298361, 2003-152464, 5-37263, 9-74320, and 2006-33988.

SUMMARY

According to an aspect of the invention, a distortion compensating apparatus including: a processor configured to generate a compensated signal by performing distortion compensation on an input signal, based on a distortion compensation coefficient depending on the input signal, to separates the compensated signal into a first signal and a second signal that have constant amplitude and that have a phase difference based on amplitude of the compensated signal, to generate a third signal by multiplying the first signal by a first coefficient, and to generate a fourth signal by multiplying the second signal by a second coefficient, and a first amplifier configured to generate a fifth signal by amplifying the third signal, a second amplifier configured to generate a sixth signal by amplifying the fourth signal, and a combiner configured to generate a seventh signal by combining the fifth signal and the sixth signal, wherein the processor is further configured to calculate the distortion compensation coefficient, the first coefficient, and the second coefficient, based on the third signal, the fourth signal and the seventh signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When a signal whose carrier polarity is inverted, such as a PSK signal, is input as an input modulation signal to a high-frequency amplifying circuit that includes a LINC-based amplifier, there is a point at which the phase is inverted by 180 degrees in a pair of phase modulation signals $Sc1(t)$ and $Sc2(t)$, which are generated by a LINC signal generating unit, and the frequency band of the signals enlarges.

Figure 2:
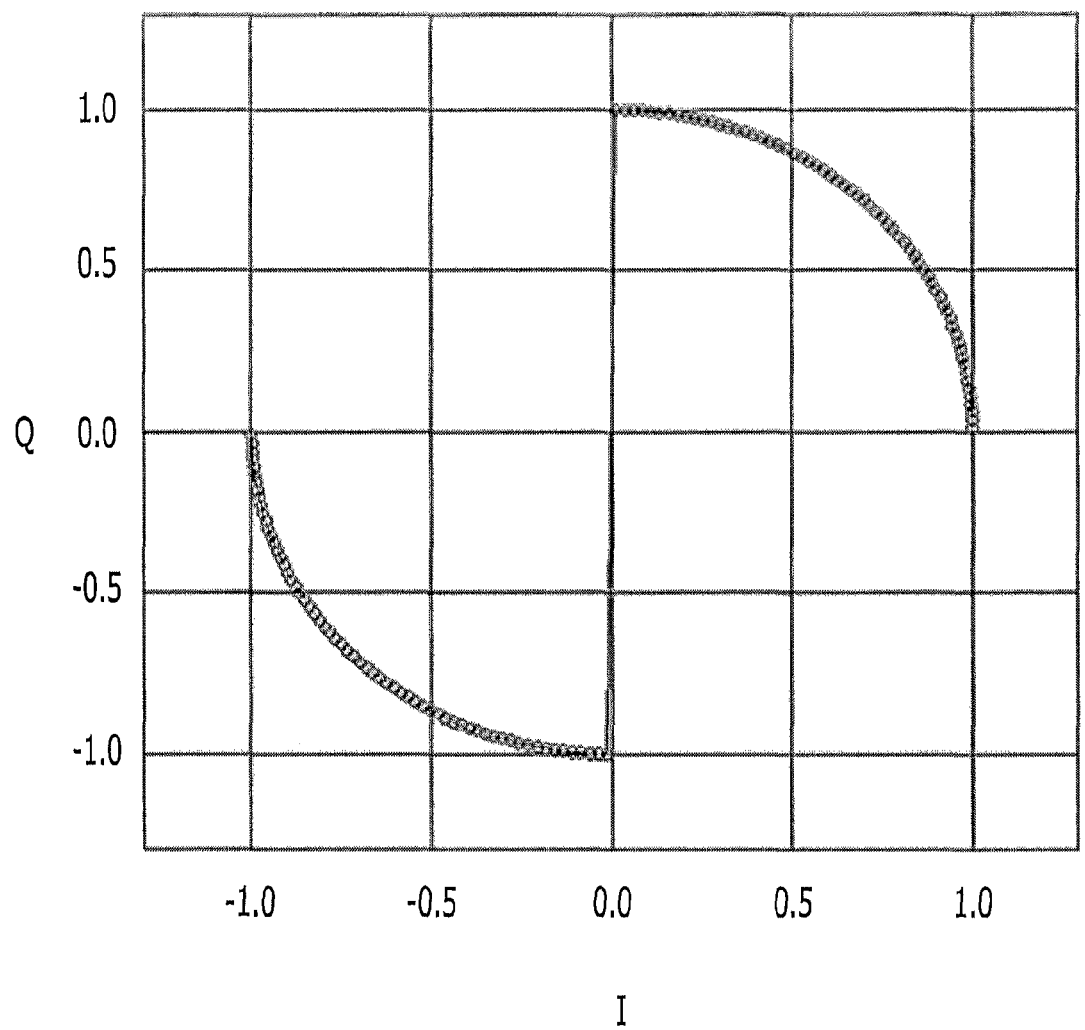
FIG. 2 is a diagram illustrating an example of the constellation of a digital signal sequence when an input modulation signal has two tones.

FIG. 2 is a diagram illustrating an example of the constellation of a digital signal sequence when an input modulation signal has two tones. FIG. 2 represents a signal Sc1, for example. In the example of FIG. 2, the signal is a constant envelope signal. Furthermore, in the example of FIG. 2, the phase is inverted by 180 degrees between a point represented by $(I,Q)=(0,-1)$ and a point represented by $(I,Q)=(0,1)$.

However, the pair of phase modulation signals $Sc1(t)$ and $Sc1(t)$, which are digital signals, are capable of expressing only half the sampling frequency, owing to the Nyquist theorem (Nyquist-Shannon sampling theorem). Thus, the digital signals are converted into analog signals by DACs, and then return components of the signals are removed by low-pass filters. Large ringing occurs in such signals, which are different from constant envelope signals.

Figure 3:
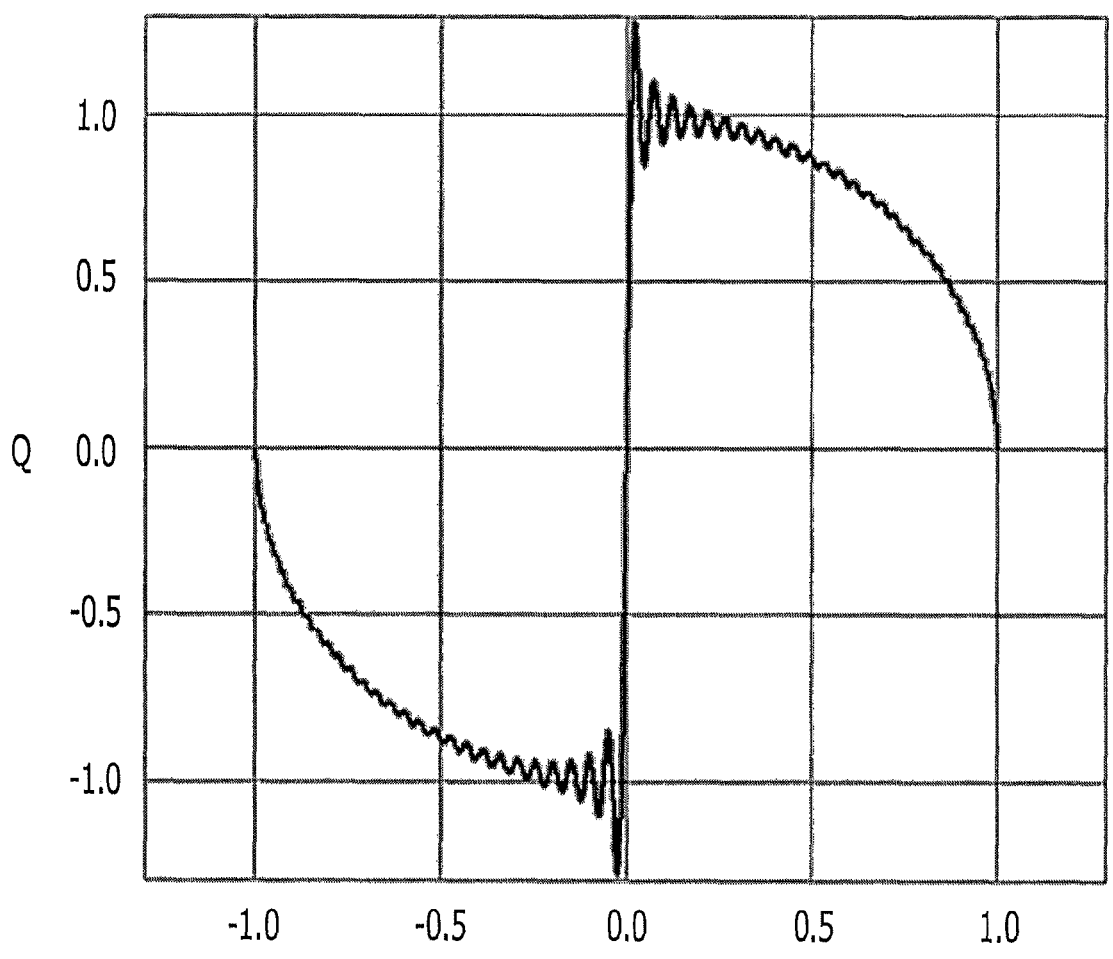
FIG. 3 is a diagram illustrating an example of the constellation after the signal illustrated in FIG. 2 is converted into an analog signal by a DAC.

FIG. 3 is a diagram illustrating an example of a constellation after the signal illustrated in FIG. 2 is converted into an analog signal by a DAC and a high-frequency component of the signal is removed by a low-pass filter. FIG. 3 illustrates, for example, a signal (analog signal) obtained after the signal Sc1 is converted into analog by a DAC.

The amplitude component of the analog signal changes in response to ringing. That is, the amplitude component of the analog signal is not constant. When such analog signals are amplified by a pair of amplifiers, the analog signals are affected by the AM/AM characteristics and AM/PM characteristics (AM/AM distortion and AM/PM distortion) of the pair of amplifiers. Due to such distortion, a combined output high-frequency signal Sout(t) deteriorates. That is, distortion occurs in the output high-frequency signal Sout(t). AM/AM characteristics represent the amplitude of an output signal relative to the amplitude of an input signal. AM/AM distortion represents distortion caused by AM/AM characteristics. AM/PM characteristics represent the phase rotation of an output signal relative to the amplitude of an input signal. AM/PM distortion represents distortion caused by AM/PM distortion.

The amplitude component of such an analog signal changes over time; and meanwhile, the digital signal input to a DAC is a constant envelope signal. That is, the amplitude component of the digital signal input to the DAC does not change over time. Thus, it is difficult to perform digital predistortion processing on a digital signal to be input to a DAC in order to compensate for the nonlinearity of an amplifier.

Figure 1:
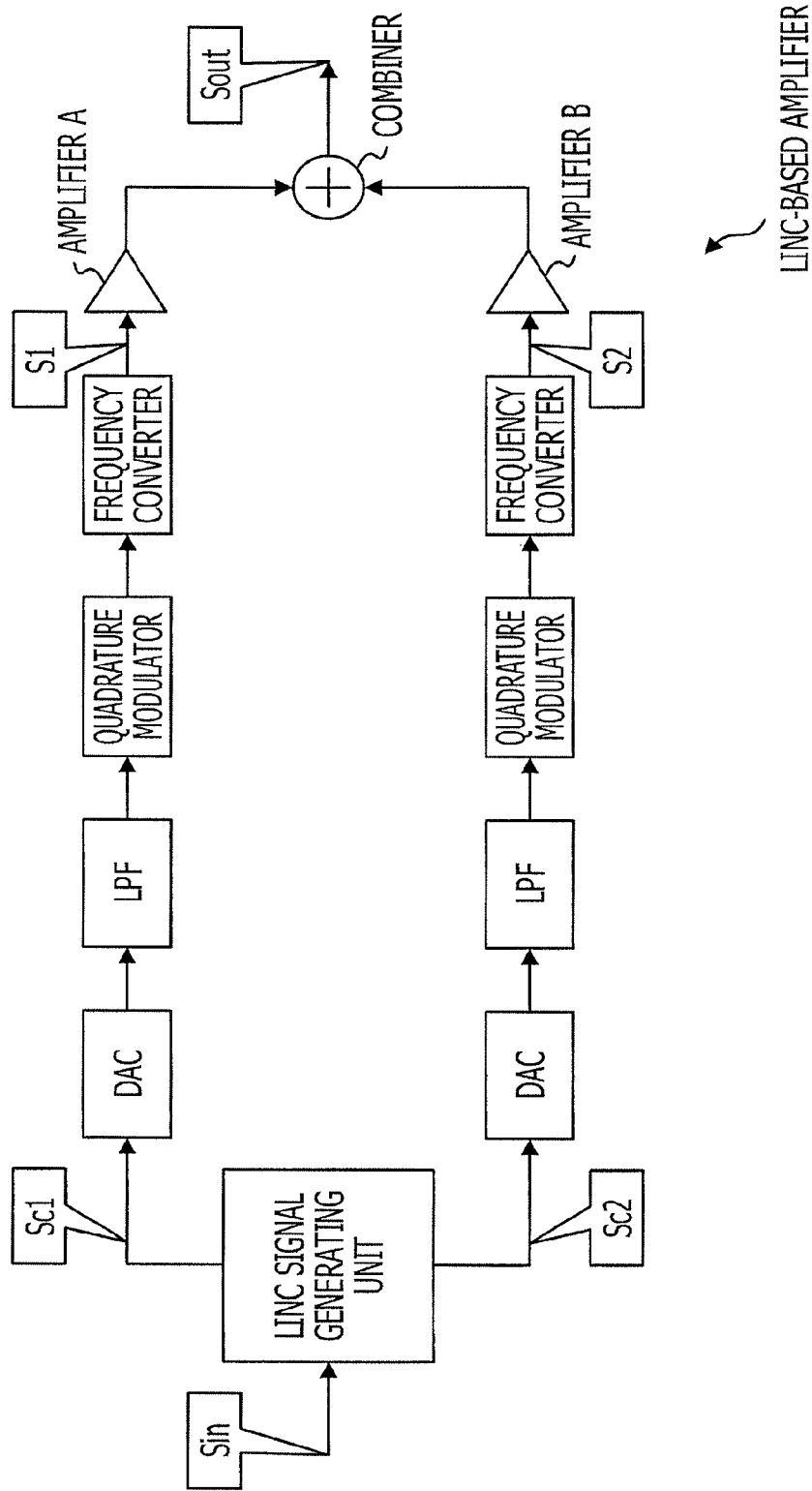
FIG. 1 is a diagram illustrating an example of a LINC-based amplifier.
Figure 4:
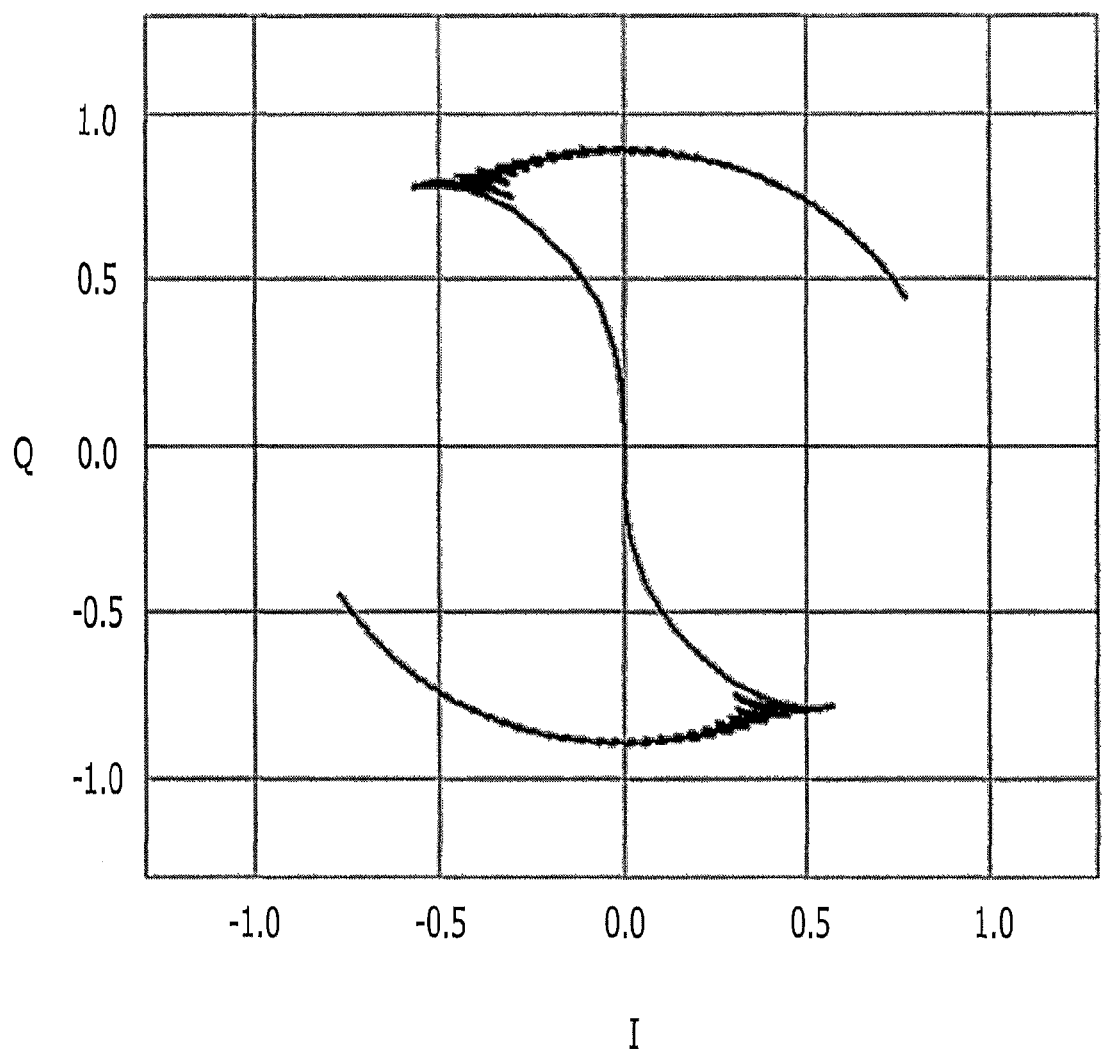
FIG. 4 illustrates an example of the constellation of output from an amplifier A illustrated in FIG. 1.

FIG. 4 illustrates an example of the constellation of output from the amplifier A illustrated in FIG. 1. FIG. 4 represents output from the amplifier A when the signal illustrated in FIG. 3 is input to the amplifier A. The output from the amplifier A is affected by AM/AM distortion and AM/PM distortion.

Figure 5:
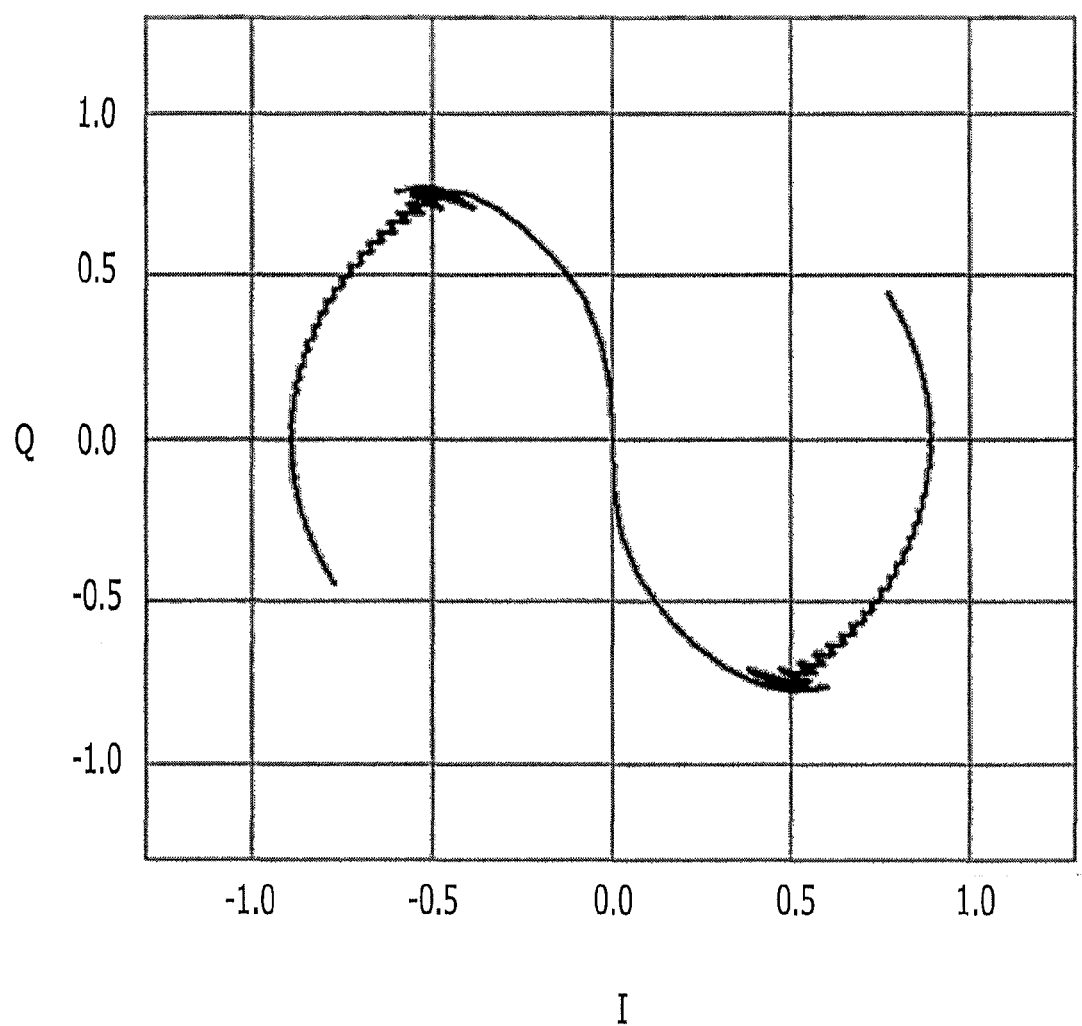
FIG. 5 illustrates an example of the constellation of output from an amplifier B illustrated in FIG. 1.

FIG. 5 illustrates an example of the constellation of output from the amplifier B illustrated in FIG. 1. FIG. 5 represents output from the amplifier B when a signal that forms a pair of signals together with the signal illustrated in FIG. 3 is input to the amplifier B. The output from the amplifier B is affected by AM/AM distortion and AM/PM distortion.

Figure 6:
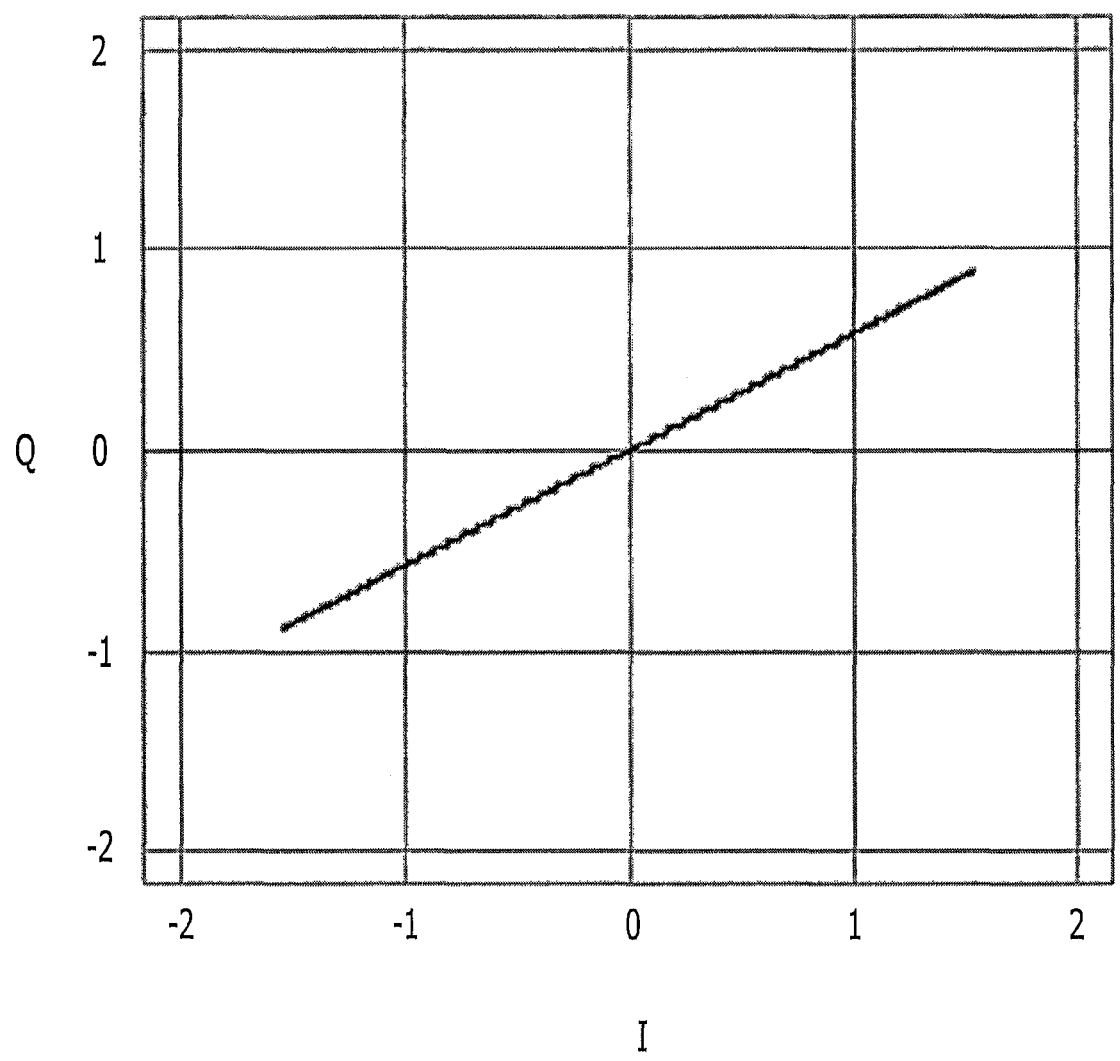
FIG. 6 is a diagram illustrating an example of the constellation of output from a combiner obtained by combing the signal illustrated in FIG. 4 and the signal illustrated in FIG. 5.

FIG. 6 is a diagram illustrating an example of the constellation of output from a combiner that combines the signal illustrated in FIG. 4 and the signal illustrated in FIG. 5. If there is no influence of distortion in an amplifier, the output from the combiner forms a straight line extending from a point represented by $(I,Q)=(-2,0)$ and a point represented by $(I,Q)=(2,0)$. However, as illustrated in FIG. 6, due to AM/AM distortion and AM/PM distortion, the output from the combiner has been rotated around the origin.

A typical combiner used in an amplifier is, for example, a Wilkinson power combiner with excellent linearity. Furthermore, with a power amplifier a Chireix power combiner may be used in order to increase efficiency. With the use of a Chireix power combiner, linearity decreases but efficiency increases.

When a combiner having low linearity, such as a Chireix power combiner, is used in a LINC-based amplifier, the phase difference between branches and the linearity of combined power decrease, and distortion occurs in high-frequency output.

Furthermore, when the imbalance between branches is compensated for by using the signal output from the combiner, due to the influence of the nonlinearity of the combiner, error occurs in the compensation for the imbalance between the branches, and high-frequency output may deteriorate.

The technique disclosed in the embodiments aims to provide a distortion compensating apparatus that suppresses the deterioration of an output high-frequency signal obtained by combining.

Hereinafter, the embodiments will be described with reference to the drawings. The configuration of the embodiments is merely an example, and the disclosed configuration is not limited to a specific configuration of the disclosed embodiments. For implementation of the disclosed embodiments, a specific configuration corresponding to an embodiment may be adopted in an appropriate manner. Individual embodiments may be implemented by combining them as long as no contradiction arises.

First Embodiment

Configuration Example

Figure 7:
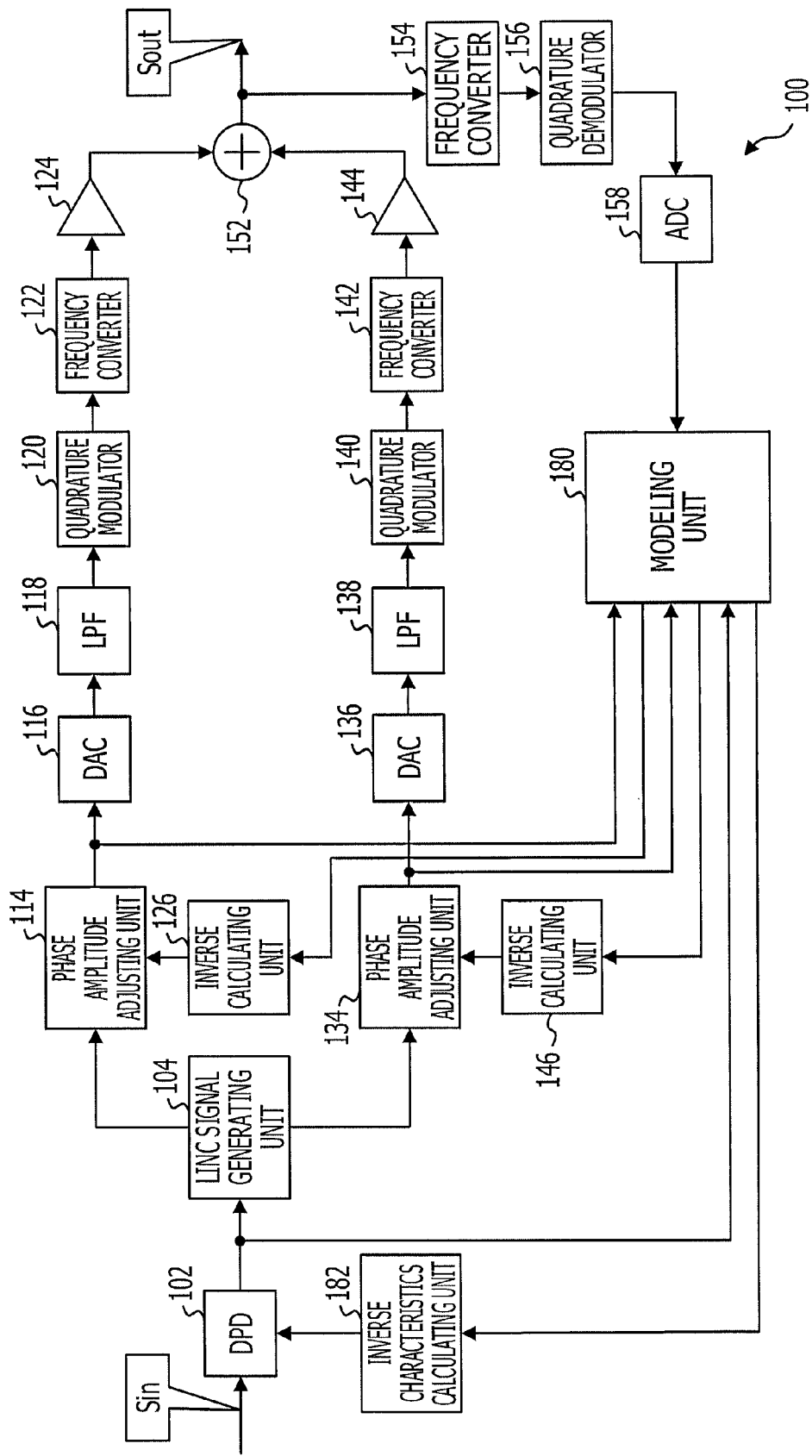
FIG. 7 is a diagram illustrating an example of the configuration of a distortion compensating apparatus according to a first embodiment.

FIG. 7 is a diagram illustrating an example of the configuration of a distortion compensating apparatus according to a first embodiment. A distortion compensating apparatus 100 includes a digital predistorter (DPD) 102, a LINC signal generating unit 104, a phase amplitude adjusting unit 114, a digital-to-analog converter (DAC) 116, a low-pass filter (LPF) 118, a quadrature modulator 120, a frequency converter 122, an amplifier 124, and an inverse calculating unit 126. The distortion compensating apparatus 100 also includes a phase amplitude adjusting unit 134, a DAC 136, a LPF 138, a quadrature modulator 140, a frequency converter 142, an amplifier 144, and an inverse calculating unit 146. The distortion compensating apparatus 100 also includes a combiner 152, a frequency converter 154, a quadrature demodulator 156, an analog-to-digital converter (ADC) 158, a modeling unit 180, and an inverse characteristics calculating unit 182.

The DPD 102 performs distortion compensation processing for an input modulation signal Sin(t). The distortion compensation processing performed is processing to multiply a signal that has not been amplified by a LINC-based amplifier by a predistortion coefficient to generate distortion in advance so as to cancel distortion generated in the LINC-based amplifier. The predistortion coefficient is a distortion compensation coefficient for compensating for distortion in an amplifier. The predistortion coefficient, which is multiplied with an input modulation signal, depends on the input modulation signal Sin(t). The predistortion coefficient is a coefficient for performing compensation such that the amplitude of an output signal from an amplifier is proportional to the amplitude of an input signal to the amplifier and that the phase difference between the input signal and the output signal is 0. The input signal and the predistortion coefficient are represented by, for example, an in-phase (I) component and a quadrature (Q) component. The predistortion coefficient is calculated by the inverse characteristics calculating unit 182. The DPD 102 outputs the processed signal to the LINC signal generating unit 104 and the modeling unit 180. The input modulation signal Sin(t) is, for example, a baseband signal. The input modulation signal Sin(t) may be an intermediate frequency (IF) signal. The DPD 102 is an example of a distortion compensating unit. The predistortion coefficient depends on the size of an input signal.

The LINC signal generating unit 104 separates the output from the DPD 102 into a pair of phase modulation signals Sc1(t) and Sc2(t) that have a phase difference corresponding to the amplitude of the output from the DPD 102, and outputs the pair of phase modulation signals Sc1(t) and Sc2(t). The signal Sc1(t) is output to the phase amplitude adjusting unit 114. The signal Sc2(t) is output to the phase amplitude adjusting unit 134.

The phase amplitude adjusting unit 114 multiplies the signal Sc1(t) output from the LINC signal generating unit 104 by a value calculated by the inverse calculating unit 126. Here, the value does not depend on the size of the signal Sc1(t). Furthermore, the value may depend on time. The phase amplitude adjusting unit 114 is an example of an adjusting unit.

The DAC 116 converts a digital signal, which is output from the phase amplitude adjusting unit 114, into an analog signal.

The low-pass filter 118 cuts off a high-frequency component of the signal output from the DAC 116.

The quadrature modulator 120 performs quadrature modulation on a signal output from the low-pass filter 118 and outputs the quadrature-modulated signal.

The frequency converter 122 includes an oscillator. The frequency converter 122 up-converts the signal that has been quadrature-modulated by the quadrature modulator 120 into a radio frequency (RF). The frequency converter 122 generates a high-frequency signal using a high-frequency signal (oscillation signal) output from the oscillator and outputs the generated high-frequency signal.

The amplifier 124 power-amplifies the signal output from the frequency converter 122. The amplifier 124 outputs the amplified signal to the combiner 152.

The phase amplitude adjusting unit 134 and the DAC 136 are similar to the phase amplitude adjusting unit 114 and the DAC 116, respectively. The LPF 138, the quadrature modulator 140, the frequency converter 142, and the amplifier 144 are similar to the LPF 118, the quadrature modulator 120, the frequency converter 122, and the amplifier 124, respectively.

The combiner 152 combines the output from the amplifier 124 and the output from the amplifier 144 together and outputs the combined signal as a signal Sout(t). The signal output from the combiner 152 is transmitted via an antenna or the like.

The frequency converter 154 down-converts the output signal from the combiner 152 from a radio frequency into a baseband frequency. The quadrature demodulator 156 demodulates the output from the frequency converter 154 into an in-phase signal and a quadrature signal. The ADC 158 converts the signals output from the quadrature demodulator 156 from an analog signal into a digital signal.

The modeling unit 180 receives the digital signal output from the DPD 102, the digital signal output from the phase amplitude adjusting unit 114, the digital signal output from the phase amplitude adjusting unit 134, and the digital signal output from the ADC 158. The modeling unit 180 receives digital signals until the number of received digital signals reaches a specific number of samples. The modeling unit 180 simulates output from the combiner 152 every time digital signals corresponding to the specific number of samples are received.

Here, "$x_i$" represents the signal output from the DPD 102, "$p_i$" represents the digital signal output from the phase amplitude adjusting unit 114, "$q_i$" represents the digital signal output from the phase amplitude adjusting unit 134, and "$r_i$" represents the digital signal output from the ADC 158. The subscript "i" added to a signal represents that the signal is the ith digital signal received by the modeling unit 180. Here, "N" represents a specific number of samples. For example, the value of N may be 100 or 1000. However, the value of N is not limited to the above examples.

The modeling unit 180 determines the value of a coefficient $c_n$ so that $\epsilon 1$ represented by Expression 4 is 0 (that is, the absolute value of $\epsilon 1$ is minimum). Any method may be used to determine the coefficient $c_n$. The modeling unit 180 calculates the coefficient $c_n$ for each N samples. Here, "$x_i$" represents an input signal corresponding to a digital signal $r_i$.

$$\sum_{i=1}^{N} \{r_i - f(x_i)\} = 0 \quad \text{[Expression 4]}$$

$$f(x) = c_1 x + c_3 |x|^2 x + \ldots + \epsilon 1$$

$$= \sum_{n=0}^{M} c_{2n+1} |x|^{2n} x + \epsilon 1$$

In Expression 4, "M" is a constant and a natural number. As the value of M increases, output from the combiner 152 may be simulated more accurately. For example, the value of M may be 1 or 2. However, the value of M is not limited to the above examples. A function "f" represents a first- or higher-order term, and "$f(x_i)$ is obtained when the ith output from the combiner 152 is simulated by the modeling unit 180.

Furthermore, the modeling unit 180 determines the values of a coefficient "a" and a coefficient "b" in such a manner that $\epsilon 2$ represented by Expression 5 is 0 (that is, the absolute value of $\epsilon 2$ is minimum). Any method may be used to determine the coefficients a and b. The modeling unit 180 calculates the coefficients a and b for each N samples.

$$\sum_{i=1}^{N} \{r_i - (f(x_i) - c_1 x_i) - (ap_i + bq_i + \epsilon 2)\} = 0 \quad \text{[Expression 5]}$$

The modeling unit 180 outputs the calculated coefficient a to the inverse calculating unit 126. The modeling unit 180 outputs the calculated coefficient b to the inverse calculating unit 146. The modeling unit 180 outputs the calculated coefficient $c_n$ to the inverse characteristics calculating unit 182.

The inverse characteristics calculating unit 182 calculates a predistortion coefficient. The inverse characteristics calculating unit 182 calculates the predistortion coefficient based on the function f output from the modeling unit 180. The inverse characteristics calculating unit 182 outputs the calculated predistortion coefficient to the DPD 102. The inverse characteristics calculating unit 182 may transmit a table representing the correspondence between an input signal and a predistortion coefficient to the DPD 102 at specific time intervals. When such a table is transmitted from the inverse characteristics calculating unit 182 to the DPD 102, the DPD 102 stores therein the table.

The inverse calculating unit 126 calculates the inverse of the coefficient a (1/a). The inverse calculating unit 126 outputs the calculated value to the phase amplitude adjusting unit 114.

The inverse calculating unit 146 calculates the inverse of the coefficient b (1/b). The inverse calculating unit 146 outputs the calculated value to the phase amplitude adjusting unit 134.

On the basis of the coefficients a and b, the imbalance between the branches of the LINC-based amplifier is corrected.

The modeling unit 180 may output the coefficients a and b to the inverse calculating unit 146. At this point, the inverse calculating unit 146 calculates the inverse of the coefficient b (1/b). Furthermore, the inverse calculating unit 146 calculates a value obtained by normalizing the calculated inverse by using the inverse of the coefficient a (1/a). That is, the value represented by a/b is calculated by the inverse calculating unit 146. The inverse calculating unit 146 outputs the calculated value to the phase amplitude adjusting unit 134. At this point, the inverse calculating unit 126 outputs the value 1 to the phase amplitude adjusting unit 114. The value 1 is obtained by normalizing the inverse of the coefficient a (1/a) by the inverse of the coefficient a (1/a).

Furthermore, the modeling unit 180 may output the coefficients a and b to the inverse calculating unit 126. At this point, the inverse calculating unit 126 calculates the inverse of the coefficient a (1/a). Furthermore, the inverse calculating unit 126 calculates a value obtained by normalizing the calculated inverse by the inverse of the coefficient b (1/b). That is, the value represented by b/a is calculated by the inverse calculating unit 126. The inverse calculating unit 126 outputs the calculated value to the phase amplitude adjusting unit 114. At this point, the inverse calculating unit 146 outputs the value 1 to the phase amplitude adjusting unit 134. The value 1 is a value obtained by normalizing the inverse of the coefficient b (1/b) by the inverse of the coefficient b (1/b).

The inverse calculating unit 126, the inverse calculating unit 146, and the inverse characteristics calculating unit 182 may be included in the modeling unit 180. That is, the modeling unit 180 may operate as the inverse calculating unit 126, the inverse calculating unit 146, and the inverse characteristics calculating unit 182.

(Operation of Distortion Compensating Apparatus)

Operation of the distortion compensating apparatus 100 will be explained below.

Figure 8:
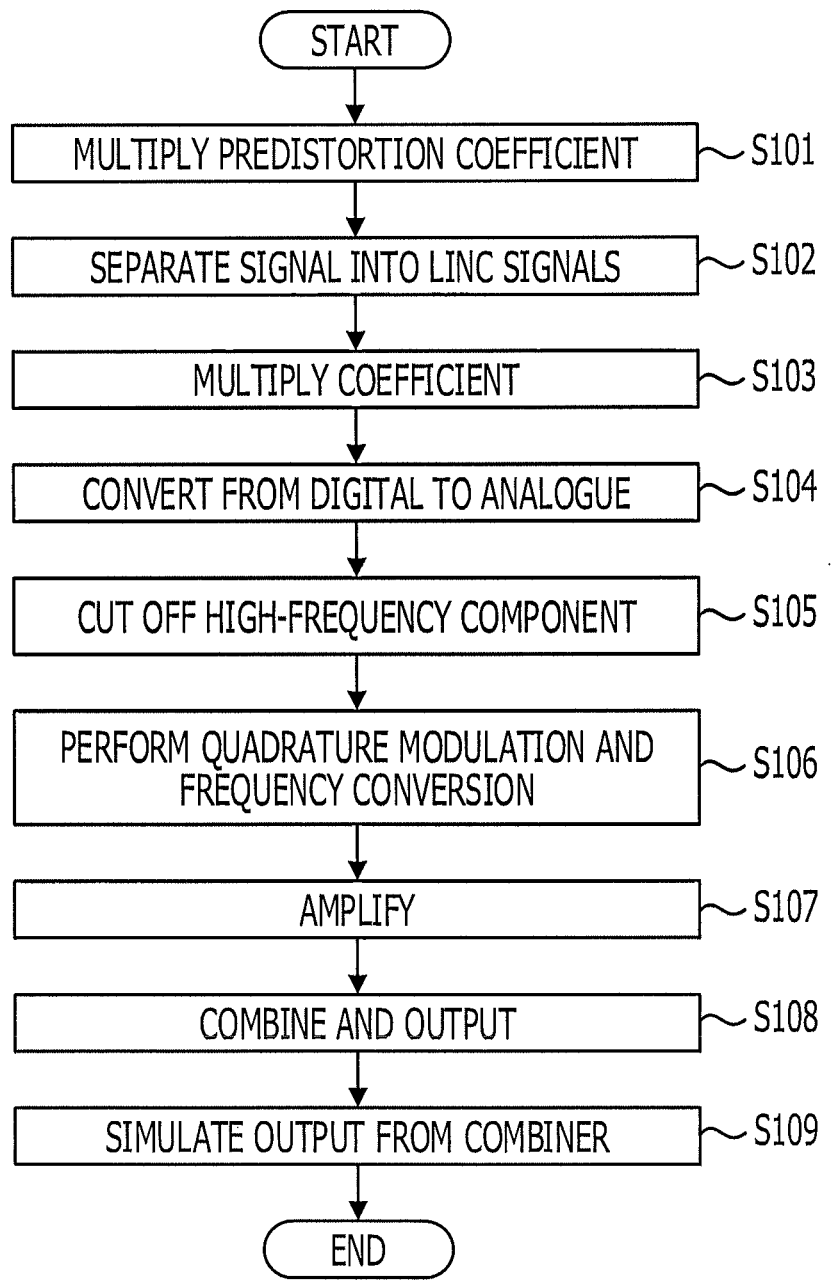
FIG. 8 is a diagram illustrating an example of the operation flow of a distortion compensating apparatus.

FIG. 8 illustrates an example of the operation flow of the distortion compensating apparatus 100.

The DPD 102 of the distortion compensating apparatus 100 receives a digital signal Sin(t) to be transmitted. The signal used here is a complex signal. The DPD 102 multiplies the digital signal Sin(t) by a predistortion coefficient and outputs the processed signal (S101). The predistortion coefficient is a coefficient for compensating for distortion generated in a range from the LINC signal generating unit 104 to the combiner 152 inclusive. The predistortion coefficient is calculated by the inverse characteristics calculating unit 182. The DPD 102 provides, by means of the predistortion coefficient, an input signal with characteristics inverse to distortion characteristics provided by the LINC-based amplifier. The predistortion coefficient depends on the input signal. The DPD 102 may store therein the correspondence between a signal and a predistortion coefficient, which is calculated by the inverse characteristics calculating unit 182, as a table. The DPD 102 outputs a signal obtained by multiplying the input signal by the predistortion coefficient to the LINC signal generating unit 104.

The LINC signal generating unit 104 receives the signal output from the DPD 102. The LINC signal generating unit 104 separates the digital signal into a pair of phase modulation signals Sc1(t) and Sc2(t) that have a phase difference corresponding to the amplitude of the digital signal (S102). The LINC signal generating unit 104 outputs the signal Sc1(t) to the phase amplitude adjusting unit 114. The LINC signal generating unit 104 outputs the signal Sc2(t) to the phase amplitude adjusting unit 134. The signals output from the LINC signal generating unit 104 are expressed, for example, by amplitude and phase. Furthermore, the signals output from the LINC signal generating unit 104 may be expressed by an in-phase (I) component and a quadrature phase (Q) component.

The phase amplitude adjusting unit 114 multiplies the digital signal output from the LINC signal generating unit 104 by a specific coefficient and outputs the processed digital signal (S103). The specific coefficient is calculated by the inverse calculating unit 126. The phase amplitude adjusting unit 114 adjusts the phase and amplitude of the signal in accordance with the specific coefficient. The phase amplitude adjusting unit 114 performs adjustment using the specific coefficient so that the output from the amplifier 124 and the output from the amplifier 144 are not imbalanced.

The DAC 116 converts the digital signal output from the phase amplitude adjusting unit 114 into an analog signal (S104).

The LPF 118 cuts off a high-frequency component of the analog signal converted by the DAC 116 (S105). After the high-frequency component is cut off, the processed signal is output to the quadrature modulator 120.

The quadrature modulator 120 performs quadrature modulation on the signal output from the LPF 118. The frequency converter 122 converts, using a high-frequency signal output from the oscillator, the frequency of the signal output from the quadrature modulator 120 into a radio frequency and outputs the processed signal (S106).

The amplifier 124 amplifies the signal output from the frequency converter 122 (S107). The signal to be amplified by the amplifier 124 is subjected to distortion compensation processing in advance by the DPD 102 and the like.

Similar to the signal Sc1(t), the signal Sc1(t) output from the LINC signal generating unit 104 is processed by the phase amplitude adjusting unit 134, the DAC 136, the LPF 138, the quadrature modulator 140, the frequency converter 142, and the amplifier 144.

The combiner 152 combines the signal output from the amplifier 124 and the signal output from the amplifier 144 together and outputs the combined signal (S108). The output signal is transmitted to an external apparatus via an antenna or the like. Furthermore, a portion of the output signal is input to the frequency converter 154.

The frequency converter 154 down-converts the output signal from the combiner 152 from a radio frequency to a baseband frequency. The quadrature demodulator 156 demodulates the output from the frequency converter 154 into an in-phase signal and a quadrature signal. The ADC 158 converts the signals output from the quadrature demodulator 156 into a digital signal.

The modeling unit 180 receives the digital signal output from the DPD 102, the digital signal output from the phase amplitude adjusting unit 114, the digital signal output from the phase amplitude adjusting unit 134, and the digital signal output from the ADC 158. The modeling unit 180 calculates a function f(x) which simulates output from the combiner 152 every time digital signals corresponding to a specific number of samples are received. Furthermore, the modeling unit 180 calculates a coefficient a and a coefficient b for correcting the imbalance between the branches of the LINC-based amplifier (S109). The modeling unit 180 outputs the calculated coefficient a to the inverse calculating unit 126. The modeling unit 180 outputs the calculated coefficient b to the inverse calculating unit 146. The modeling unit 180 outputs the calculated coefficient $c_n$ (or function f(x)) to the inverse characteristics calculating unit 182.

The inverse calculating unit 126 calculates the inverse of the coefficient a output from the modeling unit 180 and outputs the calculated value to the phase amplitude adjusting unit 114. The inverse calculating unit 146 calculates the inverse of the coefficient b output from the modeling unit 180 and outputs the calculated value to the phase amplitude adjusting unit 134.

The inverse characteristics calculating unit 182 calculates a predistortion coefficient (S109). The inverse characteristics calculating unit 182 receives the coefficient $c_n$ (or function f(x)) output from the modeling unit 180. The inverse characteristics calculating unit 182 calculates, based on the coefficient $c_n$, a predistortion coefficient for compensating for AM/AM distortion and AM/PM distortion. The inverse characteristics calculating unit 182 outputs the calculated predistortion to the DPD 102.

The inverse characteristics calculating unit 182 calculates the predistortion coefficient as described below, for example. The inverse characteristics calculating unit 182 normalizes the function f(x) by using the sum of the coefficients $c_n$. The function obtained by normalizing the function f(x) by using the sum of the coefficients $c_n$ is defined as a function $f_N(x)$.

$$f_N(x) = \frac{f(x)}{c_1 + c_3 + \ldots} = \frac{f(x)}{\sum_{j=0}^{M} c_{2j+1}} \quad \text{[Expression 6]}$$

The inverse characteristics calculating unit 182 acquires, based on the function $f_N$, which is obtained by normalizing the function f, the characteristics inverse to the characteristics of the LINC-based amplifier, and calculates a predistortion coefficient. The DPD 102 performs distortion compensation for an input signal, in accordance with the predistortion coefficient calculated by the inverse characteristics calculating unit 182.

Furthermore, for example, a method based on a least mean squares (LMS) algorithm, a method based on an exponential weighting recursive least square (RLS) algorithm, or the like may be adopted as a method to calculate a predistortion coefficient (distortion compensation coefficient). An algorithm that is used as a method to calculate a predistortion coefficient is not limited to the above examples. The predistortion coefficient is updated, for example, at specific time intervals.

The characteristics of a combiner and an amplifier may change in accordance with the passage of time, the operating temperature, the environmental temperature, an input signal, and the like. Thus, by updating the predistortion coefficient at specific time intervals, the predistortion coefficient is capable of following changes in the characteristics of the combiner and the amplifier. The predistortion coefficient may be updated (calculated) independently of this operation flow.

A series of processing operations may be performed by hardware or software.

Steps describing a program include not only processing operations performed in a time sequence manner in accordance with the written order but also processing operations performed in parallel or independently, the processing operations being not necessarily performed in a time sequence manner.

(Example of Hardware Configuration of Distortion Compensating Apparatus According to First Embodiment)

Figure 9:
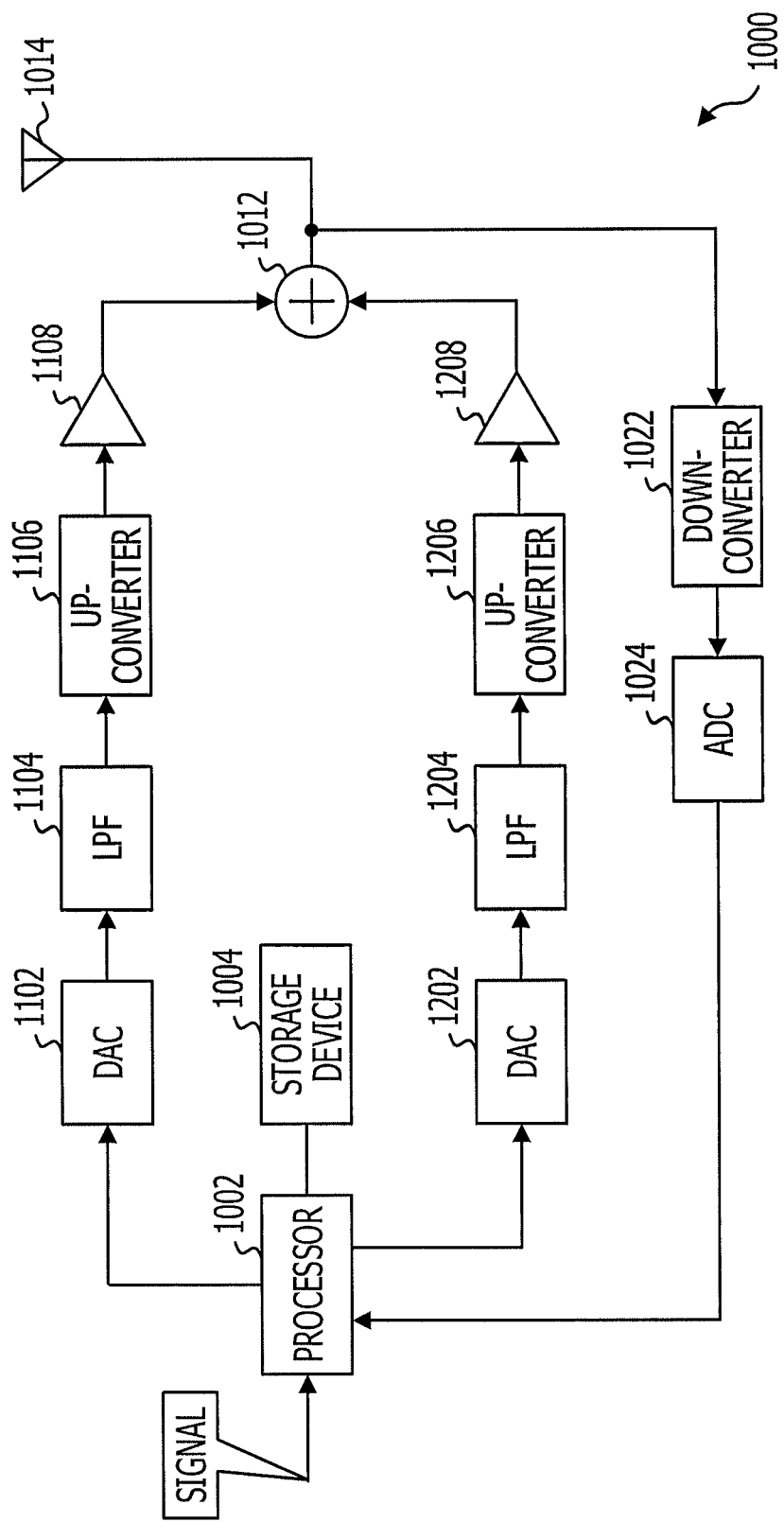
FIG. 9 is a diagram illustrating an example of the hardware configuration of the distortion compensating apparatus according to the first embodiment.

FIG. 9 is a diagram illustrating an example of the hardware configuration of a distortion compensating apparatus according to the first embodiment. A distortion compensating apparatus 1000 up-converts an input digital signal into a radio frequency, amplifies the processed signal, and outputs the amplified signal. The distortion compensating apparatus 1000 includes a processor 1002, a storage device 1004, a DAC 1102, an LPF 1104, an up-converter 1106, and an amplifier 1108. The distortion compensating apparatus 1000 also includes a DAC 1202, an LPF 1204, an up-converter 1206, an amplifier 1208, a combiner 1012, and an antenna 1014. The distortion compensating apparatus 100 is implemented by the hardware configuration of the distortion compensating apparatus 1000, for example.

The processor 1002 is, for example, a central processing unit (CPU) or a digital signal processor (DSP). The processor 1002 controls the entire distortion compensating apparatus 1000. An application specific integrated circuit (ASIC), a field-programmable gate array (FPGA), or the like may be used as the processor 1002.

The storage device 1004 is, for example, a random access memory (RAM) or a read-only memory (ROM). Alternatively, the storage device 1004 is, for example, an erasable programmable read-only memory (EPROM) or a hard disk drive (HDD). A secondary storage device may include a removable medium, that is, a portable recording medium. The removable medium is, for example, a universal serial bus (USB) memory, or a disk recording medium, such as a compact disk (CD), a digital versatile disk (DVD), or the like. The storage device 1004 may store therein a correspondence table that represents the correspondence between an input signal and a predistortion coefficient or the like.

When the processor 1002 executes a program stored in the storage device 1004, the distortion compensating apparatus 1000 implements the functions of the DPD 102, the LINC signal generating unit 104, the phase amplitude adjusting unit 114, the inverse calculating unit 126, the modeling unit 180, the inverse characteristics calculating unit 182, and the like.

The DAC 1102 converts a digital signal output from the processor 1002 to an analog signal. The DAC 1102 implements the function of the DAC 116.

The LPF 1104 removes a high-frequency component from the analog signal output from the DAC 1102. The LPF 1104 implements the function of the LPF 118.

The up-converter 1106 implements the functions of the quadrature modulator 120 and the frequency converter 122.

The amplifier 1108 amplifies an analog signal output from the up-converter 1106. Various amplifiers may be used as the amplifier 1108. However, it is desirable that an amplifier having the same characteristics as the characteristics of the amplifier 1208 is used as the amplifier 1108. The amplifiers 1108 and 1208 implement the functions of the amplifiers 124 and 144, respectively.

The DAC 1202, the LPF 1204, the up-converter 1206, and the amplifier 1208 have functions similar to those of the DAC 1102, the LPF 1104, the up-converter 1106, and the amplifier 1108, respectively.

The combiner 1012 combines the output from the amplifier 1108 and the amplifier 1208. The combiner 1012 implements the function of the combiner 152. For example, a Chireix power combiner is used as the combiner 1012. However, the combiner 1012 is not limited to a Chireix power combiner.

The antenna 1014 transmits the signal combined by the combiner 1012 to a separate apparatus.

(Variation)

Here, a variation of the modeling unit 180 will be described. Here, a signal $r_i$ that is used to calculate a coefficient $c_n$ (function f(x)) has a size greater than or equal to a specific threshold. Furthermore, a signal $r_i$ that is used to calculate a coefficient a and a coefficient b has a size smaller than the specific threshold. Units other than the modeling unit 180 have the configuration as described above.

The modeling unit 180 receives the digital signal output from the DPD 102, the digital signal output from the phase amplitude adjusting unit 114, the digital signal output from the phase amplitude adjusting unit 134, and the digital signal output from the ADC 158. The modeling unit 180 receives digital signals until the number of received digital signals reaches a specific number of samples. The modeling unit 180 simulates output from the combiner 152 every time digital signals corresponding to the specific number of samples are received.

Here, "$x_i$" represents the signal output from the DPD 102, "$p_i$" represents the digital signal output from the phase amplitude adjusting unit 114, "$q_i$" represents the digital signal output from the phase amplitude adjusting unit 134, and "$r_i$" represents the digital signal output from the ADC 158. The subscript "i" added to a signal represents that the signal is the ith digital signal received by the modeling unit 180. Here, "N" represents a specific number of samples. For example, the value of N may be 100 or 1000. However, the value of N is not limited to the above examples. Here, it is assumed that, among digital signals $r_i$ (i=1 . . . N), the number of digital signals $r_i$ having a size greater than or equal to a specific value S is J and the number of digital signals $r_i$ having a size smaller than the specific value S is K. Here, the relationship among the values N, J, and K is represented by N=J+K. Furthermore, the digital signals $r_i$ having a size greater than or equal to the specific value S are represented by $r_j$ (j=1 . . . J). A signal output from the DPD 102 that corresponds to a digital signal $r_j$ is represented by $x_j$, a digital signal output from the phase amplitude adjusting unit 114 that corresponds to a digital signal $r_j$ is represented by $p_j$, and a digital signal output from the phase amplitude adjusting unit 134 that corresponds to a digital signal $r_j$ is represented by $q_j$. Furthermore, the digital signals $r_i$ having a size smaller than the specific value S are represented by $r_k$ (k=1 . . . K). A signal output from the DPD 102 that corresponds to a digital signal $r_k$ is represented by $x_k$, a digital signal output from the phase amplitude adjusting unit 114 that corresponds to a digital signal $r_k$ is represented by $p_k$, and a digital signal output from the phase amplitude adjusting unit 134 that corresponds to a digital signal $r_k$ is represented by $q_k$. On the basis of the assumption that the size of an output signal from the distortion compensating apparatus 100 is regarded as being proportional to the size of an input signal to the distortion compensating apparatus 100 when the size of a digital signal $r_i$ is smaller than the specific value S, the specific value S is determined in advance.

The modeling unit 180 determines the value of the coefficient $c_n$ so that $\epsilon 1$ represented by Expression 7 is 0 (that is, the absolute value of $\epsilon 1$ is minimum). Any method may be used to determine the coefficient $c_n$. The modeling unit 180 calculates the coefficient $c_n$ every N samples. Here, "$x_j$" represents an input signal corresponding to a digital signal $r_j$.

$$\sum_{j=1}^{J} \{r_j - f(x_j)\} = 0 \qquad \text{[Expression 7]}$$

$$f(x) = c_1 x + c_3 |x|^2 x + \ldots + \varepsilon 1$$

$$= \sum_{n=0}^{M} c_{2n+1} |x|^{2n} x + \varepsilon 1$$

In Expression 7, "M" is a constant and a natural number. As the value of M increases, output from the combiner 152 is simulated more accurately. For example, the value of M may be 1 or 2. However, the value of M is not limited to the above examples. A function "f" represents a first- or higher-order term, and "$f(x_j)$" is obtained when output $r_j$ from the combiner 152 is simulated by the modeling unit 180. Furthermore, f(x) is calculated by using a digital signal $r_j$ having a size greater than or equal to the specific value S. The coefficient $c_n$ is calculated by using a digital signal $r_j$ for which the size of a corresponding output signal from the distortion compensating apparatus 100 is regarded as not being proportional to the size of a corresponding input signal to the distortion compensating apparatus 100.

Furthermore, the modeling unit 180 determines the values of the coefficients a and b in so that ε2 represented by Expression 8 is 0 (that is, the absolute value of ε2 is minimum). Any method may be used to determine the coefficients a and b. The modeling unit 180 calculates the coefficients a and b every N samples.

$$\sum_{k=1}^{K} \{r_k - (f(x_k) - c_1 x_k) - (ap_k + bq_k + \varepsilon 2)\} = 0 \quad \text{[Expression 8]}$$

The modeling unit 180 outputs the calculated coefficient a to the inverse calculating unit 126. The modeling unit 180 outputs the calculated coefficient b to the inverse calculating unit 146. The modeling unit 180 outputs the calculated coefficient $c_n$ to the inverse characteristics calculating unit 182. The coefficients a and b are calculated by using a digital signal $r_k$ having a size smaller than the specific value S. The coefficients a and b are calculated by using a digital signal $r_k$ for which the size of a corresponding output signal from the distortion compensating apparatus 100 is regarded as being proportional to the size of a corresponding input signal to the distortion compensating apparatus 100.

The output signal may be deteriorated due to imbalance between the branches of the LINC-based amplifier and the nonlinearity of the combiner. When the size of the output signal is small, the output signal deteriorates due to the influence of the imbalance between the branches of the LINC-based amplifier. When the size of the output signal is large, the output signal deteriorates due to the influence of the nonlinearity of the combiner. Thus, the modeling unit 180 according to this variation adjusts the nonlinearity of the combiner by using a digital signal for which the size of a corresponding output signal is greater than or equal to a specific value, and corrects the imbalance between the branches of the LINC-based amplifier by using a digital signal for which the size of a corresponding output signal is smaller than the specific value.

(Operation and Effects of First Embodiment)

The distortion compensating apparatus 100 simulates the characteristics of an amplifier, a combiner, and the like in accordance with output from the combiner 152 by using a polynomial expression. The distortion compensating apparatus 100 compensates for distortion in a LINC-based amplifier by performing distortion compensation for an input signal before the input signal is separated into LINC signals. A predistortion coefficient (distortion compensation coefficient) for compensating for distortion in a LINC-based amplifier is calculated based on the output signal. Furthermore, the distortion compensating apparatus 100 adjusts the balance between branches of the LINC-based amplifier by multiplying separated LINC signals by specific coefficients. The specific coefficients are calculated based on the difference between an output signal and a three- or higher-order term of a function f obtained by simulating the LINC-based amplifier.

The distortion compensating apparatus 100 is capable of compensating for the characteristics of a combiner, the distortion characteristics of an amplifier, and the imbalance between the amplifier 124 and the like for processing a signal Sc1 and the amplifier 144 and the like for processing a signal Sc2. Furthermore, the distortion compensating apparatus 100 suppresses the deterioration of output from the combiner 152.

The distortion compensating apparatus 100 is capable of suppressing the deterioration of high-frequency output by distortion compensation for a LINC-based amplifier and by correcting the imbalance between the branches of the LINC-based amplifier.

Since the distortion compensating apparatus 100 compensates for distortion based on output from the combiner 152, a combiner having a low linearity may be used as the combiner 152. That is, in the distortion compensating apparatus 100, a combiner having a low linearity but good efficiency may be used.

The characteristics of the combiner 152, the amplifier 124, and the amplifier 144 may change due to a deterioration over time, the operating environment (temperature and the like), and the like. Even when the characteristics of an amplifier and the like change, the distortion compensating apparatus 100 is capable of achieving more appropriate distortion compensation by calculating a predistortion coefficient at specific time intervals by using output from a DPD, output from a phase amplitude adjusting unit, and output from a combiner.

Second Embodiment

A second embodiment will now be described. The second embodiment and the first embodiment have common characteristics. Thus, differences between the second embodiment and the first embodiment will be mainly explained, and the explanation of the common points will be omitted.

(Example of Configuration)

Figure 10:
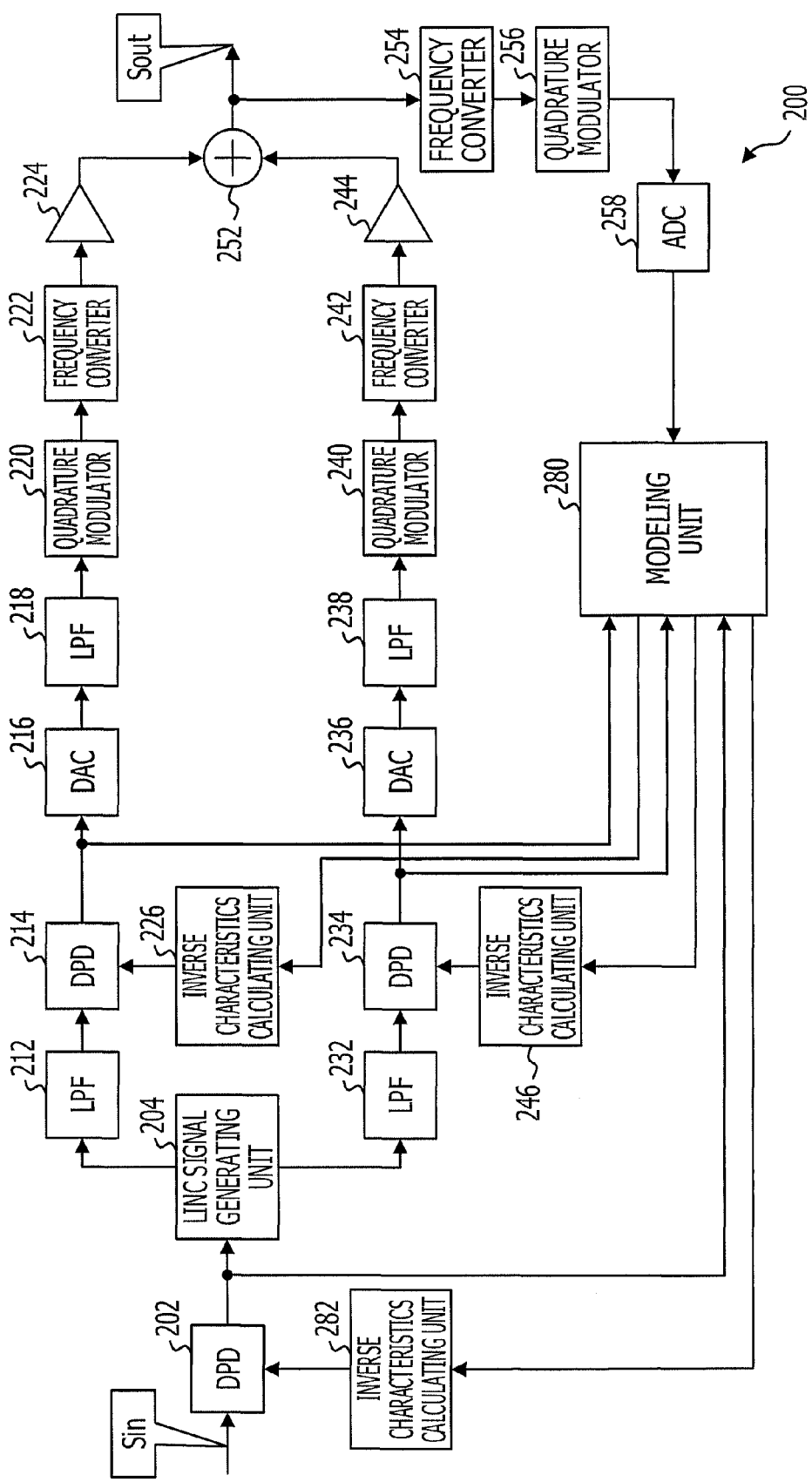
FIG. 10 is a diagram illustrating an example of the configuration of a distortion compensating apparatus according to a second embodiment.

FIG. 10 is a diagram illustrating an example of the configuration of a distortion compensating apparatus according to the second embodiment. A distortion compensating apparatus 200 includes a DPD 202, a LINC signal generating unit 204, a first LPF (LPF) 212, a DPD 214, a DAC 216, a second LPF 218, a quadrature modulator 220, a frequency converter 222, an amplifier 224, and an inverse characteristics calculating unit 226. The distortion compensating apparatus 200 also includes a first LPF 232, a DPD 234, a DAC 236, a second LPF 238, a quadrature modulator 240, a frequency converter 242, an amplifier 244, and an inverse characteristics calculating unit 246. The distortion compensating apparatus 200 also includes a combiner 252, a frequency converter 254, a quadrature demodulator 256, an ADC 258, a modeling unit 280, and an inverse characteristics calculating unit 282.

The DPD 202 performs distortion compensation processing for an input modulation signal Sin(t). The distortion compensation processing performed here is processing to multiply a signal that has not been amplified by a LINC-based amplifier by a predistortion coefficient to generate distortion in advance and cancel distortion generated in the LINC-based amplifier. The predistortion coefficient is a distortion compensation coefficient for compensating for distortion in an amplifier. The predistortion coefficient that is multiplied with an input modulation signal depends on the input modulation signal Sin(t). The predistortion coefficient is a coefficient for performing compensation so that the amplitude of an output signal from an amplifier is proportional to the amplitude of an input signal to the amplifier and that the phase difference between the input signal and the output signal is 0. The predistortion coefficient is calculated by the inverse characteristics calculating unit 282. The DPD 202 outputs the processed signal to the LINC signal generating unit 204 and the modeling unit 280. The input modulation signal Sin(t) is, for example, a baseband signal. The input modulation signal Sin(t) may be an intermediate frequency (IF) signal. The DPD 202 is an example of a distortion compensating unit.

The LINC signal generating unit 204 separates the output from the DPD 202 into a pair of phase modulation signals Sc1(t) and Sc2(t) that have a phase difference corresponding to the amplitude of the output from the DPD 202. The signal Sc1(t) is output to the first LPF 212. The signal Sc2(t) is output to the first LPF 232.

The first LPF 212 cuts off a high-frequency component of the signal output from the LINC signal generating unit 204.

The DPD 214 performs distortion compensation processing for output from the first LPF 212. The distortion compensation processing performed here is processing to multiply a signal that has not been amplified by the amplifier 224 by a predistortion coefficient to generate distortion in advance and cancel distortion generated in the amplifier 224. The predistortion coefficient is a distortion compensation coefficient for compensating for distortion in an amplifier. The predistortion coefficient that is multiplied with the output from the first LPF 212 depends on the output from the first LPF 212. The predistortion coefficient is a coefficient for performing compensation so that the amplitude of an output signal is proportional to the amplitude of an input signal and that the phase difference between the input signal and the output signal is 0. The predistortion coefficient is calculated by the inverse characteristics calculating unit 226. The DPD 214 is an example of a distortion compensating unit.

The DAC 216 converts a digital signal that is output from the DPD 214 into an analog signal.

The second LPF 218 cuts off a high-frequency component of the signal output from the DAC 216.

The quadrature modulator 220 performs quadrature modulation on the signal output from the second LPF 218 and outputs the processed signal.

The frequency converter 222 includes an oscillator. The frequency converter 222 up-converts the signal that has been quadrature-modulated by the quadrature modulator 220 into a radio frequency (RF). The frequency converter 222 generates a high-frequency signal by using a high-frequency signal (oscillation signal) output from the oscillator and outputs the generated high-frequency signal.

The amplifier 224 power-amplifies the signal output from the frequency converter 222. The amplifier 224 outputs the amplified signal to the combiner 252.

The inverse characteristics calculating unit 226 calculates a predistortion coefficient. The inverse characteristics calculating unit 226 calculates the predistortion coefficient based on a function g output from the modeling unit 280. The relationship between the output from the DPD 214 and the output from the amplifier 224 may be understood from the function g. With the use of the function g, the inverse characteristics calculating unit 226 calculates the predistortion coefficient. The inverse characteristics calculating unit 226 outputs the calculated predistortion coefficient to the DPD 214. The inverse characteristics calculating unit 226 may transmit a table representing the correspondence between an input signal and a predistortion coefficient to the DPD 214 at specific time intervals. When a table is transmitted from the inverse characteristics calculating unit 226 to the DPD 214, the DPD 214 stores therein the transmitted table.

The first LPF 232, the DPD 234, and the DAC 236 are similar to the first LPF 212, the DPD 214, and the DAC 216, respectively. The second LPF 238, the quadrature modulator 240, the frequency converter 242, the amplifier 244, and the inverse characteristics calculating unit 246 are similar to the second LPF 218, the quadrature modulator 220, the frequency converter 222, the amplifier 224, and the inverse characteristics calculating unit 226, respectively.

The combiner 252 combines the output from the amplifier 224 and the output from the amplifier 244 together and outputs the combined signal as a signal Sout(t). The signal output from the combiner 252 is transmitted via an antenna or the like.

The frequency converter 254 down-converts the output signal from the combiner 252 from an RF frequency to a baseband frequency. The quadrature demodulator 256 demodulates the output from the frequency converter 254 into an in-phase signal and a quadrature signal. The ADC 258 converts the signal output from the quadrature demodulator 256 from an analog signal into a digital signal.

The modeling unit 280 receives the digital signal output from the DPD 202, the digital signal output from the DPD 214, the digital signal output from the DPD 234, and the digital signal output from the ADC 258. The modeling unit 280 receives digital signals until the number of received digital signals reaches a specific number of samples. The modeling unit 280 simulates output from the combiner 252 every time receiving digital signals corresponding to the specific number of samples.

Here, "$x_i$" represents the signal output from the DPD 202, "$p_i$" represents the digital signal output from the DPD 214, "$q_i$" represents the digital signal output from the DPD 234, and "$r_i$" represents the digital signal output from the ADC 258. The subscript "i" added to a signal represents that the signal is the ith digital signal received by the modeling unit 280. Here, "N" represents a specific number of samples. The value of N may be, for example, 100 or 1000. However, the value of N is not limited to the above examples. Here, it is assumed that, among digital signals $r_i$ (i=1 . . . N), the number of digital signals $r_i$ having a size greater than or equal to a specific value S is J and the number of digital signals $r_i$ having a size smaller than the specific value S is K. Here, the relationship between the values N, J, and K is represented by N=J+K. Furthermore, the digital signals $r_i$ having a size greater than or equal to the specific value S are represented by $r_j$ (j=1 . . . J). A signal output from the DPD 202 that corresponds to a digital signal $r_j$ is represented by $x_j$, a digital signal output from the DPD 214 that corresponds to a digital signal $r_j$ is represented by $p_j$, and a digital signal output from the DPD 234 that corresponds to a digital signal $r_j$ is represented by $q_j$. Furthermore, the digital signals $r_i$ having a size smaller than the specific value S are represented by $r_k$ (k=1 . . . K). A signal output from the DPD 202 that corresponds to a digital signal $r_k$ is represented by $x_k$, a digital signal output from the DPD 214 that corresponds to a digital signal $r_k$ is represented by $p_k$, and a digital signal output from the DPD 234 that corresponds to a digital signal $r_k$ is represented by $q_k$. On the basis of the assumption that the size of an output signal from the distortion compensating apparatus 200 is regarded as being proportional to the size of an input signal to the distortion compensating apparatus 200 when the size of a digital signal $r_i$ is smaller than the specific value S, the specific value S is determined in advance.

The modeling unit 280 determines the value of a coefficient $c_n$ so that $\epsilon 1$ represented by Expression 9 is 0 (that is, the absolute value of $\epsilon 1$ is minimum). Any method may be used to determine the coefficient $c_n$. The modeling unit 280 calculates the coefficient $c_n$ every N samples. Here, "$x_j$" represents an input signal that corresponds to the digital signal $r_j$.

$$\sum_{j=1}^{J} \{r_j - f(x_j)\} = 0 \quad \text{[Expression 9]}$$

$$f(x) = c_1 x + c_3 |x|^2 x + \ldots + \varepsilon 1$$

$$= \sum_{n=0}^{M} c_{2n+1} |x|^{2n} x + \varepsilon 1$$

In Expression 9, "M" is a constant and a natural number. As the value of M increases, output from the combiner 252 is simulated more accurately. For example, the value of M may be 1 or 2. However, the value of M is not limited to the above examples. A function "f" represents a first- or higher-order term, and "f($x_j$)" is obtained when output $r_j$ from the combiner 252 is simulated by the modeling unit 280. Furthermore, f(x) is calculated by using a digital signal $r_j$ having a size greater than or equal to the specific value S. The coefficient $c_n$ is calculated by using a digital signal $r_j$ for which the size of a corresponding output signal from the distortion compensating apparatus 200 is regarded as not being proportional to the size of a corresponding input signal to the distortion compensating apparatus 200.

Furthermore, the modeling unit 280 determines the values for the function g (or coefficient $u_n$) and a function h (or coefficient $v_n$) in such a manner that $\epsilon 2$ represented by Expression 10 is 0 (that is, the absolute value of $\epsilon 2$ is minimum). Any method may be used to determine the functions g and h. The modeling unit 280 calculates the functions g and h every N samples. Here, the functions g and h simulate the amplitude, phase, and nonlinearity of an amplifier.

$$\sum_{k=1}^{K} \{r_k - (f(x_k) - c_1 x_k) - (g(p_k) + h(q_k) + \varepsilon 2)\} = 0 \quad \text{[Expression 10]}$$

$$g(p) = u_1 p + u_3 |p|^2 p + \ldots = \sum_{n=0}^{M1} u_{2n+1} |p|^{2n} p$$

$$h(q) = v_1 q + v_3 |q|^2 q + \ldots = \sum_{n=0}^{M1} v_{2n+1} |q|^{2n} q$$

In Expression 10, M1 is a constant and a natural number. As the value of M1 increases, the functions g and h simulate the amplitude, phase, and nonlinearity of an amplifier more accurately. For example, the value of M1 may be 1 or 2.

The modeling unit 280 outputs the calculated coefficient $u_n$ to the inverse characteristics calculating unit 226. The modeling unit 280 outputs the calculated coefficient $v_n$ to the inverse characteristics calculating unit 246. The modeling unit 280 outputs the calculated coefficient $c_n$ to the inverse characteristics calculating unit 282. The coefficients $u_n$ and $v_n$ are calculated by using a digital signal $r_k$ having a size smaller than a specific value S. The coefficients $u_n$ and $v_n$ are calculated by using a digital signal $r_k$ for which the size of a corresponding output signal from the distortion compensating apparatus 200 is regarded as being proportional to the size of a corresponding input signal to the distortion compensating apparatus 200.

The inverse characteristics calculating unit 282 calculates a predistortion coefficient. The inverse characteristics calculating unit 282 calculates the predistortion coefficient based on a function f output from the modeling unit 280. The inverse characteristics calculating unit 282 outputs the calculated predistortion coefficient to the DPD 202. The inverse characteristics calculating unit 282 may transmit a table representing the correspondence between an input signal and a predistortion coefficient to the DPD 202 at specific time intervals. When a table is transmitted from the inverse characteristics calculating unit 282 to the DPD 202, the DPD 202 stores therein the transmitted table.

The inverse characteristics calculating unit 282 calculates the predistortion coefficient, for example, as described below. The inverse characteristics calculating unit 282 normalizes a function f(x) by using the sum of coefficients $c_n$. The function obtained by normalizing the function f(x) by using the sum of the coefficients $c_n$ is defined as a function $f_N(x)$.

$$f_N(x) = \frac{f(x)}{c_1 + c_3 + \ldots} = \frac{f(x)}{\sum_{j=0}^{M} c_{2j+1}} \quad \text{[Expression 11]}$$

The inverse characteristics calculating unit 282 calculates characteristics inverse to the characteristic of a LINC-based amplifier by using the function $f_N$, which is obtained by normalizing the function f, and calculates the predistortion coefficient. The DPD 202 performs distortion compensation for an input signal by using the predistortion coefficient calculated by the inverse characteristics calculating unit 282.

The inverse characteristics calculating unit 226 calculates a predistortion coefficient. The inverse characteristics calculating unit 226 calculates the predistortion coefficient based on the function g output from the modeling unit 280. The inverse characteristics calculating unit 226 outputs the calculated predistortion coefficient to the DPD 214. The inverse characteristics calculating unit 226 may transmit a table representing the correspondence between an input signal and a predistortion coefficient to the DPD 214 at specific time intervals. When a table is transmitted from the inverse characteristics calculating unit 226 to the DPD 214, the DPD 214 stores therein the transmitted table.

The inverse characteristics calculating unit 246 calculates a predistortion coefficient. The inverse characteristics calculating unit 246 calculates the predistortion coefficient based on the function h output from the modeling unit 280. The inverse characteristics calculating unit 246 outputs the calculated predistortion coefficient to the DPD 234. The inverse characteristics calculating unit 246 may transmit a table representing the correspondence between an input signal and a predistortion coefficient at specific time intervals. When a table is transmitted from the inverse characteristics calculating unit 246 to the DPD 234, the DPD 234 stores therein the transmitted table.

The inverse characteristics calculating unit 226 and the inverse characteristics calculating unit 246 may calculate predistortion coefficients by normalizing individual functions on the basis of the gain of the inverse characteristics of the function g or the function h.

The inverse characteristics calculating unit 226, the inverse characteristics calculating unit 246, and the inverse characteristics calculating unit 282 may be included in the modeling unit 280. That is, the modeling unit 280 may operate as the inverse characteristics calculating unit 226, the inverse characteristics calculating unit 246, and the inverse characteristics calculating unit 282.

(Operation of Distortion Compensating Apparatus)

Operation of the distortion compensating apparatus 200 will now be described.

Figure 11:
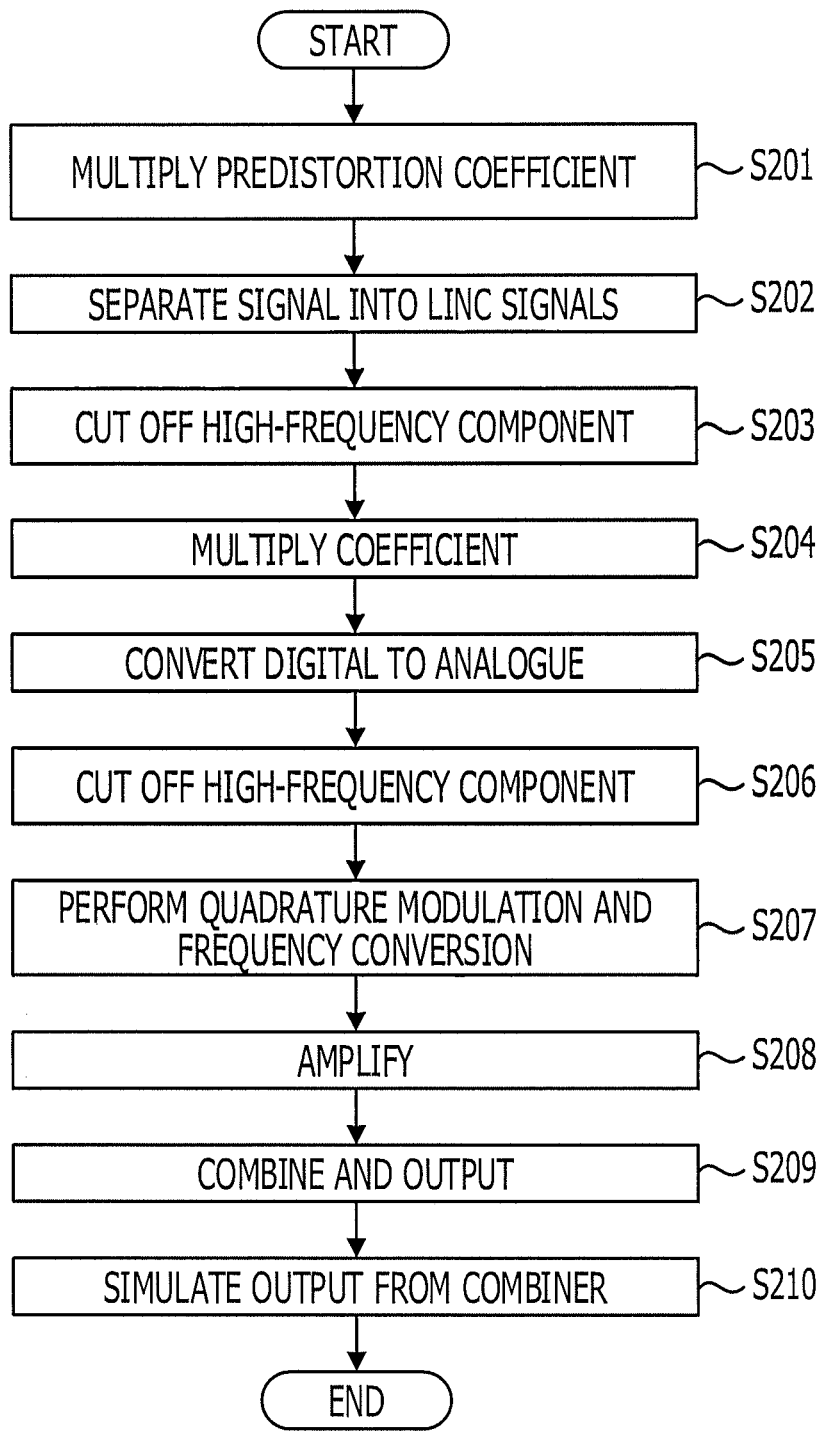
FIG. 11 is a diagram illustrating an example of the operation flow of a distortion compensating apparatus.

FIG. 11 is a diagram illustrating an example of the operation flow of the distortion compensating apparatus 200.

The DPD 202 of the distortion compensating apparatus 200 receives a digital signal Sin(t) to be transmitted. The signal used here is a complex signal. The DPD 202 multiples the digital signal Sin(t) by a predistortion coefficient and outputs the processed signal (S201). The predistortion coefficient is a coefficient for compensating for distortion generated in a range from the LINC signal generating unit 204 to the combiner 252 inclusive. The predistortion coefficient is calculated by the inverse characteristics calculating unit 282. The DPD 202 provides, by using the predistortion coefficient, an input signal with characteristics inverse to distortion characteristics provided by a LINC-based amplifier. The predistortion coefficient depends on an input signal. The DPD 202 may store therein the correspondence between a signal and a predistortion coefficient, which is calculated by the inverse characteristics calculating unit 282, as a table. The DPD 202 outputs a signal obtained by multiplying the input signal by the predistortion coefficient to the LINC signal generating unit 204.

The LINC signal generating unit 204 receives the signal output from the DPD 202. The LINC signal generating unit 204 separates the digital signal into a pair of phase modulation signals Sc1(t) and Sc2(t) that have a phase difference corresponding to the amplitude of the digital signal (S202). The LINC signal generating unit 204 outputs the signal Sc1(t) to the first LPF 212. The LINC signal generating unit 204 outputs the signal Sc2(t) to the first LPF 232. The signals output from the LINC signal generating unit 204 are expressed by, for example, amplitude and phase. Furthermore, the signals output from the LINC signal generating unit 204 may be expressed by an in-phase (I) component and a quadrature phase (Q) component.

The first LPF 212 cuts off a high-frequency component of the signal Sc1(t) (S203). After the high-frequency component is cut off, the processed signal is input to the DPD 214. The frequency band obtained by band limiting by the first LPF 212 is set to be similar to the frequency band of an analog signal by the second LPF 218 or narrower than the frequency band of an analog signal from the second LPF 218. Ringing occurs in a signal transmitted through the first LPF 212. That is, even if a signal input to the first LPF 212 is a constant envelope signal, an amplitude component of a signal output from the first LPF 212 is not constant.

The DPD 214 multiplies the digital signal output from the first LPF 212 by a specific coefficient and outputs the processed signal (S204). The specific coefficient is calculated by the inverse characteristics calculating unit 226. The DPD 214 adjusts the phase and amplitude of a signal by using the specific coefficient. The imbalance between the output from the amplifier 224 and the output from the amplifier 244 is corrected by using the specific coefficient.

The DAC 216 converts the digital signal output from the DPD 214 into an analog signal (S205).

The second LPF 218 cuts off a high-frequency component of the analog signal converted by the DAC 216 (S206). After the high-frequency component is cut off, the processed signal is output to the quadrature modulator 220.

The quadrature modulator 220 performs quadrature modulation on the signal output from the second LPF 218. The frequency converter 222 converts, using a high-frequency signal output from the oscillator, the frequency of the signal output from the quadrature modulator 220 into a radio frequency and outputs the processed signal (S207).

The amplifier 224 amplifies the signal output from the frequency converter 222 (S208). The signal to be amplified by the amplifier 224 has been subjected to distortion compensation processing in advance by the DPD 202 and the like.

Similar to the signal Sc1(t), the signal Sc2(t) output from the LINC signal generating unit 204 is processed by the first LPF 232, the DPD 234, the DAC 236, the second LPF 238, the quadrature modulator 240, the frequency converter 242, and the amplifier 244.

The combiner 252 combines the signal output from the amplifier 224 and the signal output from the amplifier 244 and outputs the combined signal (S209). The output signal is transmitted to an external apparatus via an antenna or the like. Furthermore, part of the output signal is input to the frequency converter 254.

The frequency converter 254 down-converts the output signal from the combiner 252 from a radio frequency into a baseband frequency. The quadrature demodulator 256 demodulates the output from the frequency converter 254 into an in-phase signal and a quadrature signal. The ADC 258 converts the signals output from the quadrature demodulator 256 into a digital signal.

The modeling unit 280 receives the digital signal output from the DPD 202, the digital signal output from the DPD 214, the digital signal output from the DPD 234, and the digital signal output from the ADC 258. The modeling unit 280 receives digital signals until the number of received digital signals reaches a specific number of samples. The modeling unit 280 calculates a function f(x) which simulates output from the combiner 252 every time digital signals corresponding to the specific number of samples are received. Furthermore, the modeling unit 280 calculates functions g(p) and h(q) to correct the imbalance between the branches of the LINC-based amplifier and adjust the nonlinearity of the amplifier 224 and the amplifier 244 (S210). The modeling unit 280 outputs the calculated coefficient $u_n$ (function g(p)) to the inverse characteristics calculating unit 226. The modeling unit 280 outputs the calculated coefficient $v_n$ (or function h(q)) to the inverse characteristics calculating unit 226. The modeling unit 280 outputs the calculated coefficient $c_n$ (function f(x)) to the inverse characteristics calculating unit 282.

The inverse characteristics calculating unit 282 calculates a predistortion coefficient. The inverse characteristics calculating unit 282 receives a coefficient $c_n$ (function f(x)) output from the modeling unit 280. The inverse characteristics calculating unit 282 calculates the predistortion coefficient for compensating for AM/AM distortion and AM/PM distortion by using the coefficient $c_n$. The inverse characteristics calculating unit 282 outputs the calculated predistortion coefficient to the DPD 202. The DPD 202 performs distortion compensation for an input signal in accordance with the predistortion coefficient calculated by the inverse characteristics calculating unit 282.

The inverse characteristics calculating unit 226 calculates the characteristics inverse to the characteristics of the function g output from the modeling unit 280, and outputs the calculated characteristics to the DPD 214. The inverse characteristics calculating unit 246 calculates the characteristics inverse to the characteristics of the function h output from the modeling unit 280, and outputs the calculated characteristics to the DPD 234.

A series of processing operations may be performed by hardware or software.

Steps describing a program include not only processing operations performed in a time sequence manner in accordance with the written order but also processing operations performed in parallel or independently, the processing operations being not necessarily performed in a time sequence manner.

(Example of Hardware Configuration of Distortion Compensating Apparatus According to Second Embodiment)

The distortion compensating apparatus 200 according to the second embodiment is implemented with a hardware configuration similar to that of the distortion compensating apparatus 1000 according to the first embodiment. Hereinafter, an example of the hardware configuration of the distortion compensating apparatus 200 will be explained with reference to the distortion compensating apparatus 1000.

When the processor 1002 executes a program stored in the storage device 1004, the functions of the DPD 202, the LINC signal generating unit 204, the first LPF 212, the DPD 214, and the like are implemented. Furthermore, when the processor 1002 executes a program stored in the storage device 1004, the functions of the inverse characteristics calculating unit 226, the modeling unit 280, the inverse characteristics calculating unit 282, and the like are implemented.

In the storage device 1004, information including a predistortion coefficient used by the processor 1002 is stored.

The DAC 1102 converts a digital signal output from the processor 1002 into an analog signal. The DAC 1102 implements the function of the DAC 216.

The LPF 1104 removes a high-frequency component from the analog signal output from the DAC 1102. The LPF 1104 implements the function of the second LPF 218.

The up-converter 1106 implements the functions of the quadrature modulator 220 and the frequency converter 222.

The amplifier 1108 amplifies an analog signal output from the up-converter 1106. Various amplifiers may be used as the amplifier 1108. However, it is desirable that an amplifier having the same characteristics as those of the amplifier 1208 is used as the amplifier 1108. The amplifier 1108 and the amplifier 1208 implement the functions of the amplifier 124 and the amplifier 144, respectively.

The DAC 1202, the LPF 1204, the up-converter 1206, and the amplifier 1208 have functions similar to those of the DAC 1102, the LPF 1104, the up-converter 1106, and the amplifier 1108.

The combiner 1012 combines the output from the amplifier 1108 and the output from the amplifier 1208 together. The combiner 1012 implements the function of the combiner 152.

The antenna 1014 transmits the signal combined by the combiner 1012 to a separate apparatus.

(Operation and Effect of Second Embodiment)

The distortion compensating apparatus 200 cuts off a high-frequency component of a constant envelope digital signal generated by the LINC signal generating unit 204. Ringing occurs in the signal that has been subjected to cutting off of a high-frequency component. That is, the amplitude component of a signal that has been subjected to processing to cut off a high-frequency component from a constant envelope signal is not constant. The distortion compensating apparatus 200 performs distortion compensation processing to compensate for nonlinear distortion in an amplifier for a signal of which a high-frequency component has been cut-off. The distortion compensating apparatus 200 is capable of suppressing the deterioration of an output signal caused by ringing and distortion characteristics of an amplifier by performing distortion compensation processing for a signal in which ringing is generated. Furthermore, the distortion compensating apparatus 200 is capable of performing digital predistortion processing (distortion compensation processing) for a digital signal by performing frequency band limiting (cutting off a high-frequency component) for the digital signal.

A predistortion coefficient (distortion compensation coefficient) for compensating for distortion in the LINC-based amplifier is calculated based on an output signal. The predistortion coefficients (distortion compensation coefficients) for the amplifier 224 and the amplifier 244 are calculated based on the difference between an output signal and a third- or higher-order term of a function f which simulates the LINC-based amplifier.

An output signal may be deteriorated due to the imbalance between the branches of the LINC-based amplifier and the nonlinearity of the combiner. When the size of an output signal is small, the output signal deteriorates due to the influence of the imbalance between the branches of the LINC-based amplifier. When the size of an output signal is large, the output signal deteriorates due to the influence of the nonlinearity of the combiner. Thus, the modeling unit 280 adjusts the nonlinearity of the combiner by using a digital signal for which the size of a corresponding output signal is greater than or equal to a specific value, and corrects the imbalance between the branches of the LINC-based amplifier by using a digital signal for which the size of a corresponding output signal is smaller than the specific value.

Furthermore, the distortion compensating apparatus 200 is capable of compensating for the nonlinearity of the amplifier 224 and the amplifier 244 by identifying the amplifier 224 and the amplifier 244 by using a polynomial expression.

The distortion compensating apparatus 200 is capable of suppressing the deterioration of a high-frequency output by means of distortion compensation for the LINC-based amplifier and distortion compensation for amplifiers of the individual branches of the LINC-based amplifier.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensating apparatus comprising:
a processor configured
to generate a compensated signal by performing distortion compensation on an input signal, based on a distortion compensation coefficient depending on the input signal,
to separate the compensated signal into a first signal and a second signal that have constant amplitude and that have a phase difference based on amplitude of the compensated signal,
to generate a third signal by multiplying the first signal by a first coefficient, and
to generate a fourth signal by multiplying the second signal by a second coefficient; and
a first amplifier configured to generate a fifth signal by amplifying the third signal;
a second amplifier configured to generate a sixth signal by amplifying the fourth signal; and
a combiner configured to generate a seventh signal by combining the fifth signal and the sixth signal,
wherein the processor is further configured to:
calculate the distortion compensation coefficient, the first coefficient, and the second coefficient, based on the third signal, the fourth signal and the seventh signal;

calculate the distortion compensation coefficient, based on the seventh signal that has a size greater than or equal to a specific value; and calculates the first coefficient and the second coefficient, based on the seventh signal that has a size smaller than the specific value.

2. A distortion compensating apparatus comprising:

a processor configured to generate a first compensated signal by performing distortion compensation on an input signal, based on a first distortion compensation coefficient, and to separates the compensated signal into a first signal and a second signal that have constant amplitude and that have a phase difference based on amplitude of the first compensated signal;

a first filter configured to generate a third signal by removing a high-frequency component of the first signal;

a second filter configured to generate a fourth signal by removing a high-frequency component of the second signal;

a first amplifier;

a second amplifier; and a combiner, wherein the processor is further configured to generate a second compensated signal by performing distortion compensation on the third signal, based on a second distortion compensation coefficient depending on amplitude of the third signal, the first amplifier generates a fifth signal by amplifying the second compensated signal, the processor is further configured to generate a third compensated signal by performing distortion compensation on the fourth signal, based on a third distortion compensation coefficient depending on amplitude of the fourth signal, the second amplifier generates a sixth signal by amplifying the third compensated signal, the combiner generates a seventh signal by combining the fifth signal and the sixth signal, and the processor is further configured to calculate the first distortion compensation coefficient, based on the seventh signal that has a size greater than or equal to a specific value, and calculates the second distortion compensation coefficient and the third distortion compensation coefficient, based on the seventh signal that has a size smaller than the specific value.

3. A distortion compensating method comprising:

generating a first compensated signal by performing distortion compensation on an input signal, based on a first distortion compensation coefficient;

separating the compensated signal into a first signal and a second signal that have constant amplitude and that have a phase difference based on amplitude of the first compensated signal;

generating a third signal by removing a high-frequency component of the first signal;

generating a fourth signal by removing a high-frequency component of the second signal;

generating a second compensated signal by performing distortion compensation on the third signal, based on a second distortion compensation coefficient depending on amplitude of the third signal;

generating a fifth signal by amplifying the second compensated signal;

generating a third compensated signal by performing distortion compensation on the fourth signal, based on a third distortion compensation coefficient depending on amplitude of the fourth signal;

generating a sixth signal by amplifying the third compensated signal;

generating a seventh signal by combining the fifth signal and the sixth signal; and calculating the first distortion compensation coefficient, based on the seventh signal that has a size greater than or equal to a specific value, and calculates the second distortion compensation coefficient and the third distortion compensation coefficient, based on the seventh signal that has a size smaller than the specific value.

* * * * *